US012684975B2

(12) United States Patent
Lee et al.

(10) Patent No.: US 12,684,975 B2
(45) Date of Patent: Jul. 14, 2026

(54) LIGHT EMITTING DISPLAY DEVICE

(71) Applicant: Samsung Display Co., LTD., Yongin-si (KR)

(72) Inventors: Sang-Myoung Lee, Yongin-si (KR); Sang Hyun Kang, Yongin-si (KR); Joon Huh, Yongin-si (KR); Dae Cheol Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 426 days.

(21) Appl. No.: 18/510,508

(22) Filed: Nov. 15, 2023

(65) Prior Publication Data

US 2024/0276807 A1     Aug. 15, 2024

(30) Foreign Application Priority Data

Feb. 3, 2023     (KR) ........................ 10-2023-0015033

(51) Int. Cl.
　H10K 59/131　　　(2023.01)
　H10K 59/121　　　(2023.01)
　H10K 59/126　　　(2023.01)

(52) U.S. Cl.
　CPC ....... H10K 59/131 (2023.02); H10K 59/1213 (2023.02); H10K 59/1216 (2023.02); H10K 59/126 (2023.02); *G09G 2300/0819* (2013.01); *G09G 2300/0852* (2013.01)

(58) Field of Classification Search
　CPC ........... H10K 59/1213; H10K 59/1216; H10K 59/126; H10K 59/131; H10D 86/441; H10D 86/60; H10H 29/142; H10H 29/49
　See application file for complete search history.

(56) References Cited

U.S. PATENT DOCUMENTS

| | | |
|---|---|---|
| 2003/0071931 A1 | 4/2003 | Nakayoshi et al. |
| 2007/0171320 A1 | 7/2007 | Lin |
| 2014/0167009 A1* | 6/2014 | Lee ...................... H10K 59/126 |
| | | 257/40 |

(Continued)

FOREIGN PATENT DOCUMENTS

| | | |
|---|---|---|
| KR | 10-1997-0030494 A | 3/1999 |
| KR | 10-2014-0077002 A | 6/2014 |

(Continued)

*Primary Examiner* — Christine S. Kim
*Assistant Examiner* — Tien Tran
(74) *Attorney, Agent, or Firm* — Womble Bond Dickinson (US) LLP

(57) ABSTRACT

One or more embodiments provide a light-emitting display device including a substrate, a first transistor including a lower electrode above the substrate, a first semiconductor overlapping the lower electrode, and a first gate electrode overlapping the first semiconductor, a light-emitting diode electrically connected to the first transistor, a storage capacitor including a first storage electrode electrically connected to the lower electrode, and a second storage electrode overlapping the first storage electrode, a shielding electrode at a same layer as the lower electrode or as the first semiconductor, a data line overlapping the shielding electrode, and configured to transmit a data voltage, and an auxiliary electrode between the shielding electrode and the data line, overlapping the shielding electrode, and adjacent to the first gate electrode.

20 Claims, 15 Drawing Sheets

(56)                    References Cited

U.S. PATENT DOCUMENTS

| | | | | |
|---|---|---|---|---|
| 2017/0330928 A1* | 11/2017 | Choi | .................... | H10D 86/441 |
| 2018/0212016 A1* | 7/2018 | Choi | .................... | H10K 59/126 |
| 2021/0143241 A1* | 5/2021 | Kim | .................... | H10D 86/441 |
| 2021/0183979 A1* | 6/2021 | Lee | ...................... | G09G 3/3258 |
| 2021/0320162 A1* | 10/2021 | Jeon | ...................... | H10D 86/60 |
| 2021/0399072 A1* | 12/2021 | Song | ................. | H10K 59/1216 |
| 2023/0351962 A1* | 11/2023 | Song | ................. | G06V 40/1318 |
| 2024/0057398 A1* | 2/2024 | Park | .................. | H10K 59/1315 |
| 2025/0017061 A1* | 1/2025 | Park | .................. | H10K 59/1216 |

FOREIGN PATENT DOCUMENTS

| | | |
|---|---|---|
| KR | 10-2018-0088551 A | 8/2018 |
| KR | 10-2021-0152630 A | 12/2021 |

* cited by examiner

LIGHT EMITTING DISPLAY DEVICE

CROSS-REFERENCE TO RELATED APPLICATION

This application claims priority to, and the benefit of, Korean Patent Application No. 10-2023-0015033 filed in the Korean Intellectual Property Office on Feb. 3, 2023, the entire contents of which are incorporated herein by reference.

BACKGROUND

1. Field

The present disclosure relates to a light-emitting display device including light-emitting diodes.

2. Description of the Related Art

As display devices, a light-emitting display device for displaying an image by controlling luminance of light-emitting elements, and a liquid crystal display for displaying an image by controlling transmittance of a liquid crystal layer, are widely used. The light-emitting display device does not require a separate light source, such as a backlight, so that it is possible to reduce a thickness and weight of the display device. Further, the light-emitting display device has high-quality characteristics, such as low power consumption, high luminance, and high response speed.

The light-emitting display device may include a display area corresponding to a screen displaying an image, and pixels may be located in the display area. Each pixel may include a light-emitting diode as a light-emitting element, and a pixel circuit for driving the light-emitting diode. The pixel circuit may include transistors.

The above information disclosed in this Background section is only for enhancement of understanding of the background of the disclosure, and therefore may contain information that does not form the prior art.

SUMMARY

A transistor including an oxide semiconductor has a larger threshold voltage change than a transistor including a silicon semiconductor, and thus may be significantly affected by parasitic capacitance, thereby degrading display quality. Embodiments are to provide a light-emitting display device that may reduce parasitic capacitance.

One or more embodiments provide a light-emitting display device including a substrate, a first transistor including a lower electrode above the substrate, a first semiconductor overlapping the lower electrode, and a first gate electrode overlapping the first semiconductor, a light-emitting diode electrically connected to the first transistor, a storage capacitor including a first storage electrode electrically connected to the lower electrode, and a second storage electrode overlapping the first storage electrode, a shielding electrode at a same layer as the lower electrode or as the first semiconductor, a data line overlapping the shielding electrode, and configured to transmit a data voltage, and an auxiliary electrode between the shielding electrode and the data line, overlapping the shielding electrode, and adjacent to the first gate electrode.

In plan view, a distance between the auxiliary electrode and the first gate electrode may be less than a distance between the data line and the first gate electrode.

In plan view, a distance between the auxiliary electrode and the first gate electrode may be less than a distance between the shielding electrode and the first gate electrode.

The auxiliary electrode may be in an electrically floating state.

The auxiliary electrode may be at a same layer as the first gate electrode.

A length of the auxiliary electrode may be equal to or greater than a length of the first gate electrode.

The light-emitting display device may further include an auxiliary driving voltage line above the substrate, and configured to transmit a driving voltage, wherein the shielding electrode is electrically connected to the auxiliary driving voltage line.

The shielding electrode, the first semiconductor, and the second storage electrode may be integrally formed.

The light-emitting display device may further include a hold capacitor including a first hold electrode and a second hold electrode, wherein the first hold electrode includes a portion of the auxiliary driving voltage line overlapping the second hold electrode, and wherein the second hold electrode is integrally formed with the second storage electrode.

The shielding electrode may be integrally formed with the auxiliary driving voltage line.

The light-emitting display device may further include a hold capacitor including a first hold electrode and a second hold electrode, wherein the first hold electrode includes a portion of the second storage electrode overlapping the second hold electrode, and wherein the second hold electrode is electrically connected to the auxiliary driving voltage line.

The light-emitting display device may further include a driving voltage line electrically connected to the auxiliary driving voltage line, and a hold capacitor including a first hold electrode and a second hold electrode, wherein the first hold electrode includes a portion of the second storage electrode overlapping the second hold electrode, and wherein the second hold electrode includes an extension of the driving voltage line.

The first semiconductor may include an oxide semiconductor.

The light-emitting display device may further include a connecting member electrically connecting the first gate electrode and the first storage electrode, a first insulating layer between the lower electrode and the first semiconductor, a second insulating layer between the first semiconductor and the first gate electrode, and a third insulating layer between the first gate electrode and the connecting member.

The light-emitting display device may further include a second transistor including a second gate electrode and a second semiconductor, wherein the data line is electrically connected to one end of the second semiconductor, and wherein the connecting member is electrically connected to another end of the second semiconductor.

One or more other embodiments provide a light-emitting display device including a first gate line extending in a first direction, and configured to transmit a first gate signal, a data line extending in a second direction crossing the first direction, and configured to transmit a data signal, a first transistor including a first semiconductor, and a first gate electrode overlapping the first semiconductor, a second transistor including a second semiconductor electrically connected to the data line, and a second gate electrode electrically connected to the first gate line, a shielding electrode overlapping the data line, and configured to receive a driving voltage, and an auxiliary electrode between the data line and the shielding electrode in a third direction crossing the first direction and the second direction, at least a portion of the auxiliary electrode being between the data line and the first gate electrode in plan view with respect to the first direction.

In plan view, a distance between the auxiliary electrode and the first gate electrode may be less than a distance between the data line and the first gate electrode.

The auxiliary electrode may be in an electrically floating state.

The auxiliary electrode may overlap the first gate electrode in the first direction.

The light-emitting display device may further include an auxiliary driving voltage line extending in the first direction, and configured to transmit the driving voltage, wherein the shielding electrode is electrically connected to, or integrally formed with, the auxiliary driving voltage line.

According to the embodiments, it is possible to provide a light-emitting display device that may reduce parasitic capacitance. For example, by reducing coupling between a gate electrode of a driving transistor and a data line, it is possible to reduce or prevent deterioration in display quality, such as staining at low grayscales. In addition, according to the embodiments, there is an advantageous aspect that may be recognized throughout the present specification.

DETAILED DESCRIPTION

Figure 1:
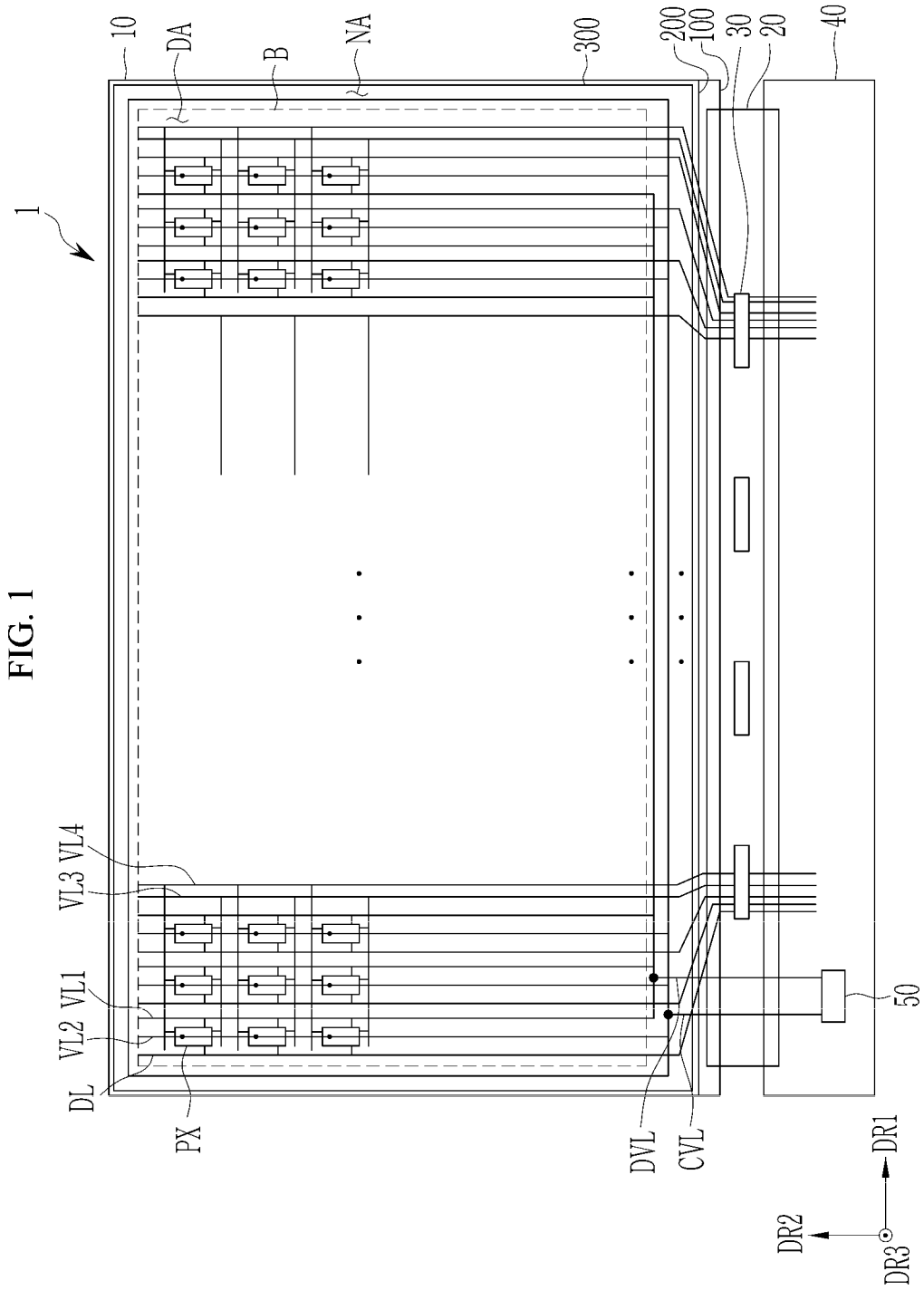
FIG. 1 illustrates a schematic top plan view of a light-emitting display device according to one or more embodiments.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The present disclosure covers all modifications, equivalents, and replacements within the idea and technical scope of the present disclosure. Further, each of the features of the various embodiments of the present disclosure may be combined or combined with each other, in part or in whole, and technically various interlocking and driving are possible. Each embodiment may be implemented independently of each other or may be implemented together in an association.

In the drawings, the relative sizes of elements, layers, and regions may be exaggerated for clarity and/or descriptive purposes. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 illustrates a schematic top plan view of a light-emitting display device according to one or more embodiments.

Referring to FIG. 1, a light-emitting display device 1 (hereinafter, also simply referred to as a "display device") includes a display panel 10, a flexible printed circuit film 20, a driving integrated circuit chip 30, a printed circuit board 40, a power module 50, and the like.

The display panel 10 may include a display area DA corresponding to a screen that displays an image, and circuits and/or wires for generating and/or transmitting various signals applied to the display area DA, and/or a non-display area NA in which wires are located. The non-display area NA may be adjacent to the display area DA, and may surround the display area DA. In FIG. 1, an inner area and an outer area of a boundary line B may be the display area DA and the non-display area NA, respectively.

The display panel 10 may include a display portion 100 and a color-converting portion 200. The display portion 100 and the color-converting portion 200 may be bonded by a sealant 300 located around an edge of the display panel 10 between the display portion 100 and the color-converting portion 200. The color-converting portion 200 may entirely overlap the display portion 100, but the display portion 100 may include an area not covered by the color-converting portion 200 for connection or bonding of the flexible printed circuit film 20. The display portion 100 may include a pad portion for connection or bonding of the flexible printed circuit film 20, and an area in which the pad portion is located may be such that the pad portion may be exposed to the outside. For example, in a lower end portion of the display panel 10, the color-converting portion 200 may be shorter than the display portion 100. The display portion 100 and the color-converting portion 200 may include areas corresponding to the display area DA and the non-display area NA of the display panel 10, respectively.

In the display area DA of the display panel 10, pixels PX may be arranged in a matrix format. In addition, a data line DL for transmitting a data voltage Vdata, a driving voltage line VL1 for transmitting a driving voltage ELVdd, a common voltage line VL2 for transmitting a common voltage ELVss, an initialization voltage line VL3 for transmitting an initialization voltage Vint, and a reference voltage line VL4 for transmitting a reference voltage Vref, may be located in the display area DA. The driving voltage line VL1, the common voltage line VL2, the initialization voltage line VL3, and the reference voltage line VL4 may extend in the second direction DR2. The driving voltage line VL1, the common voltage line VL2, the initialization voltage line VL3, and/or the reference voltage line VL4 may be connected to an auxiliary voltage line extending in the first direction DR1. Each pixel PX may receive the data voltage Vdata, the driving voltage ELVdd, the common voltage ELVss, the initialization voltage Vint, and the reference voltage Vref from these voltage lines DL, VL1, VL2, VL3, and VL4. The driving voltage ELVdd and the common voltage ELVss are power voltages applied to each pixel PX, and the driving voltage line VL1 and the common voltage line VL2 that transmit the power voltages may be referred to as power voltage lines. The driving voltage ELVdd may be a higher voltage than the common voltage ELVss. The driving voltage ELVdd may be referred to as a first power voltage or a high potential power voltage. The common voltage ELVss may be referred to as a second power voltage or a low potential power voltage.

In the non-display area NA of the display panel 10, gate drivers may be located at both sides of the display area DA. The gate driver may be integrated in the non-display area NA. The pixels PX may receive a gate signal generated by the gate driver to receive the data voltage ELVss at a timing (e.g., predetermined timing).

A driving-voltage-transmitting line DVL connected to the driving voltage line VL1, and a common-voltage-transmitting line CVL connected to the common voltage lines VL2 may be located in the non-display area NA of the display panel 10. The driving-voltage-transmitting line DVL and the common-voltage-transmitting line CVL may include portions substantially extending in the second direction DR2, and portions substantially extending in the first direction DR1, respectively. The common-voltage-transmitting line CVL may surround the display area DA. The common voltage lines VL2 may be connected to the common-voltage-transmitting line CVL at lower and upper sides of the display area DA, thereby uniformly providing the common voltage ELVss to the entire display area DA.

One end of the flexible printed circuit film 20 may be connected to or bonded to the display portion 100 of the display panel 10, and the other end thereof may be connected to or bonded to the printed circuit board 40. The driving integrated circuit chip 30 including a data driver for applying the data voltage Vdata to the data line DL may be located in the flexible printed circuit film 20.

The power module 50 that generates the power voltage, such as the driving voltage ELVdd and the common voltage ELVss, may be located in the printed circuit board 40. The power module 50 may be provided in a form of an integrated circuit chip. A signal controller that controls the data driver and the gate driver may be located on the printed circuit board 40.

Figure 2:
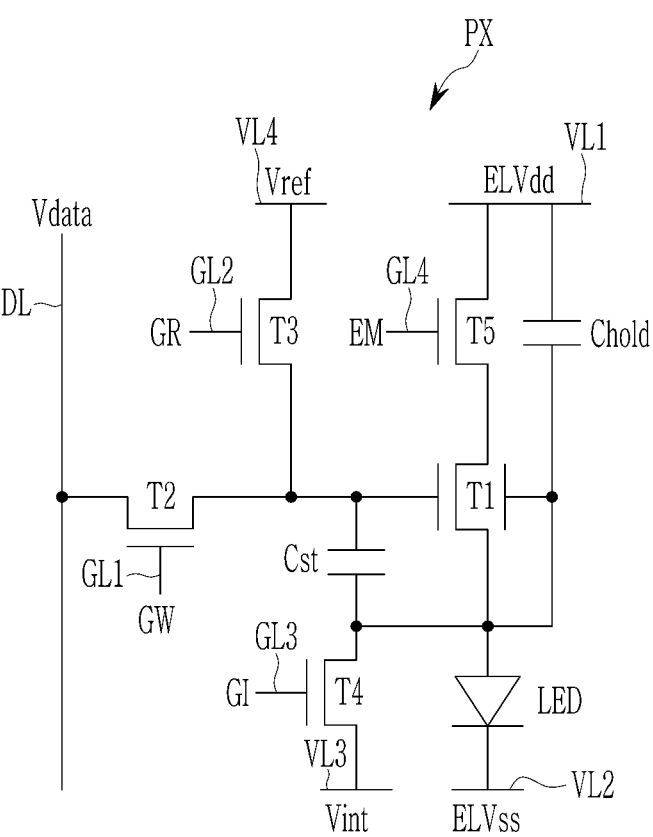
FIG. 2 illustrates a circuit diagram of one pixel of a light-emitting display device according to one or more embodiments.

FIG. 2 illustrates a circuit diagram of one pixel of a light-emitting display device according to one or more embodiments.

Referring to FIG. 2, one pixel PX may include first to fifth transistors T1 to T5, a storage capacitor Cst, a hold capacitor Chold, and a light-emitting diode LED. The light-emitting diode LED may be an organic or inorganic light-emitting diode. The first to fifth transistors T1 to T5 may be N-type transistors. The first to fifth transistors T1 to T5 may include an oxide semiconductor as a semiconductor layer. Some of the first to fifth transistors T1 to T5 may include a silicon semiconductor as a semiconductor layer. Some of the first to fifth transistors T1 to T5 may be P-type transistors.

The first transistor T1 may include a gate electrode (hereinafter referred to as a first gate electrode) connected to a first electrode (hereinafter, also referred to as a first storage electrode) of the storage capacitor Cst, a first electrode connected to a second electrode of the fifth transistor T5, and a second electrode connected to a first electrode of the light-emitting diode LED and to a second electrode (hereinafter referred to as a second storage electrode) of the storage capacitor Cst. The first transistor T1 may be a driving transistor that supplies a driving current to the light-emitting diode LED according to a voltage stored in the storage capacitor Cst. An amount of the driving current may be adjusted according to the data voltage Vdata. The first transistor T1 may further include a lower electrode (also referred to as a lower gate electrode) overlapping a channel area of a semiconductor layer. The lower electrode may be connected to the first electrode of the light-emitting diode LED and to a second electrode of the hold capacitor Chold. The lower electrode may allow to the characteristics of the first transistor T1 to be maintained without being changed during a light-emitting period.

The second transistor T2 may include a gate electrode (hereinafter, also referred to as a second gate electrode) connected to the first gate line GL1, a first electrode connected to the data line DL, and a second electrode connected to the gate electrode of the first transistor T1 and to the second electrode of the storage capacitor Cst. The second transistor T2 may be turned on according to a first gate signal GW to transmit the data voltage Vdata to the gate electrode of the first transistor T1. In this case, the data voltage Vdata may be stored in the first electrode of the storage capacitor Cst.

The third transistor T3 may include a gate electrode (hereinafter, also referred to as a third gate electrode) connected to a second gate line GL2, a first electrode connected to the reference voltage line VL4, and a second electrode connected to the gate electrode of the first transistor T1 and to the first electrode of the storage capacitor Cst. The third transistor T3 may be turned on by a second gate signal GR to transmit the reference voltage Vref to the gate electrode of the first transistor T1 to thereby initialize the gate electrode of the first transistor T1.

The fourth transistor T4 may include a gate electrode (hereinafter, also referred to as a fourth gate electrode) connected to a third gate line GL3, a first electrode connected to the initialization voltage line VL3, and a second electrode connected to the first electrode of the light-emitting diode LED and to the second electrode of the storage capacitor Cst. The fourth transistor T4 may be turned on by a third gate signal GI to transmit the initialization voltage Vint to the first electrode of the light-emitting diode LED to thereby initialize the voltage of the first electrode of the light-emitting diode LED. In this case, the fourth transistor T4 may initialize the lower electrode of the first transistor T1, the second electrode of the storage capacitor Cst, and the second electrode of the hold capacitor Chold.

The fifth transistor T5 may include a gate electrode (hereinafter, also referred to as a fifth gate electrode) connected to a fourth gate line GL4, a first electrode connected to the driving voltage line VL1, and a second electrode connected to the first electrode of the first transistor T1. The fifth transistor T5 may be turned on by a fourth gate signal EM (also referred to as a light-emitting signal) to apply the driving voltage ELVdd to the first electrode of the first transistor T1.

The storage capacitor Cst may include the first electrode connected to the gate electrode of the first transistor T1 and the second electrode connected to the first electrode of the light-emitting diode LED. Depending on the voltage stored in the storage capacitor Cst, the voltage of the gate electrode of the first transistor T1 may be changed, and the driving current outputted from the first transistor T1 may be changed. The storage capacitor Cst may maintain the voltage of the gate electrode of the first transistor T1 constant for one frame.

The hold capacitor Chold may include a first electrode (hereinafter, also referred to as a first hold electrode) connected to the driving voltage line VL1, and a second electrode (hereinafter, also referred to as a second hold electrode) connected to the lower electrode of the first transistor T1 and to the first electrode of the light-emitting diode LED. The hold capacitor Chold may maintain the voltages of the lower electrode of the first transistor T1 and the first electrode of the light-emitting diode LED to be constant during the light-emitting period.

The light-emitting diode LED may include a first electrode connected to the second electrode of the first transistor T1, to the second electrode of the storage capacitor Cst, and to the second electrode of the hold capacitor Chold, and may also include a second electrode connected to the common voltage line VL2. The first electrode and the second electrode of the light-emitting diode LED may be an anode and a cathode, respectively. The first electrode and the second electrode of the light-emitting diode LED may be referred to as a pixel electrode and a common electrode, respectively. The light-emitting diode LED may emit light of luminance (grayscale) according to a driving current generated by the first transistor T1.

An example of the operation of the circuit shown in FIG. 2, for example an operation during one frame, will be described in a case in which all of the first to fifth transistors T1 to T5 are N-type transistors.

One frame may include an initialization period, a compensation period, a write period, and a light-emitting period. When one frame starts, a high-level second gate signal GR may be applied to the third transistor T3 in the initialization period, whereby the gate electrode of the first transistor T1 and the first electrode of the storage capacitor Cst may be initialized to the reference voltage Vref. The reference voltage Vref may be at a level capable of turning on the first transistor T1. In addition, in the initialization period, a high-level third gate signal GI may be applied to the fourth transistor T4, whereby the first electrode of the light-emitting diode LED, the second electrode of the storage capacitor Cst, and the second electrode of the hold capacitor Chold may be initialized to the initialization voltage Vint. In the initialization period, the first gate signal GW and the fourth gate signal EM may be at a low level.

In the compensation period, the third gate signal GI may be changed to a low level, and a high level fourth gate signal EM may be applied, whereby the driving voltage ELVdd may be transmitted to the first electrode of the first transistor T1. In the compensation period, the first gate signal GW may be maintained at a low level, and the third gate signal GI may be maintained at a high level. In the initialization period, because the second electrode of the storage capacitor Cst is charged with the initialization voltage Vint, and because the first transistor T1 is turned on by the reference voltage Vref, in the compensation period, the driving voltage ELVdd applied to the first electrode of the first transistor T1 is transmitted to the second storage electrode of the storage capacitor Cst, so that the voltage of the second storage electrode may increase. When the voltage of the second storage electrode increases and then becomes lower than the voltage of the gate electrode of the first transistor T1 by the threshold voltage Vth of the first transistor T1, the first transistor T1 may be turned off. Because the reference voltage Vref is applied to the gate electrode of the first transistor T1, the voltage of the second storage electrode when the first transistor T1 is turned off may be represented as Equation (1) below.

$$\text{Voltage of second electrode} = V_{ref} - V_{th} \qquad (1)$$

Because the second storage electrode and the lower electrode of the first transistor T1 are connected, the voltage of the lower electrode of the first transistor T1 may be represented as Equation (1).

In the write period, the fourth gate signal EM may be changed to a low level, and the first gate signal GW of a high level may be applied, whereby the data voltage Vdata is transmitted to the gate electrode of the first transistor T1 and to the first storage electrode of the storage capacitor Cst through the second transistor T2. In the write period, the second gate signal GR may be changed to a low level, and the third gate signal GI may be maintained at a low level. As the voltage of the first storage electrode is changed, the voltage of the second storage electrode may also be changed. For example, because the reference voltage Vref is previously applied in the write period, and then the data voltage Vdata is applied in the write period, the first storage electrode may be varied by a value obtained by subtracting the reference voltage Vref from the data voltage Vdata. Accordingly, the voltage of the second storage electrode may be varied by the value obtained by subtracting the reference voltage Vref from the data voltage Vdata at the maximum. Because the voltage of the second storage electrode before entering the write period is represented as Equation (1), the voltage of the second storage electrode after the write period may be represented as Equation (2) below.

$$\text{Voltage of second storage electrode} = V_{ref} - V_{th} + \alpha \ (V_{data} - V_{ref}) \quad (2)$$

In the light-emitting period, the high level fourth gate signal EM may be applied, whereby the driving voltage ELVdd may be applied to the first electrode of the first transistor T1 through the fifth transistor T5. In the light-emitting period, the first gate signal GW, the second gate signal GR, and the third gate signal GI may be at a low level. As the driving voltage ELVdd is applied to the first electrode of the first transistor T1, the first transistor T1 may generate and output a driving current, and the light-emitting diode LED may emit light by the driving current. An amount of the driving current that determines the luminance of the light-emitting diode LED may be determined according to a value obtained by subtracting the voltage of the second electrode of the first transistor T1 and the threshold voltage Vth from the voltage of the gate electrode of the first transistor T1. Because the voltage of Equation (2) is the same as the voltage of the second electrode of the first transistor T1, and because the voltage of the gate electrode of the first transistor T1 is the same as the data voltage Vdata, the driving current may be proportional to a value obtained by subtracting the voltage of Equation (2) and the threshold voltage Vth from the data voltage Vdata. In summary, the driving current outputted by the first transistor T1 is represented as Equation (3).

$$\text{Driving current} \propto (1 - \alpha) \ (V_{data} - V_{ref}) \qquad (3)$$

As shown in Equation (3), because the driving current is determined regardless of the threshold voltage Vth of the first transistor T1, even if the threshold voltage Vth of the first transistor T1 is varied depending on the pixels PX, the driving current is not affected and display quality may be improved. However, the first transistor T1 may be greatly affected by parasitic capacitance due to a large change in the threshold voltage Vth. Accordingly, stains may occur at a low grayscale and display quality may be deteriorated. Hereinafter, a structure of the display device that may reduce the parasitic capacitance affecting the first transistor T1 will be described.

Figure 3:
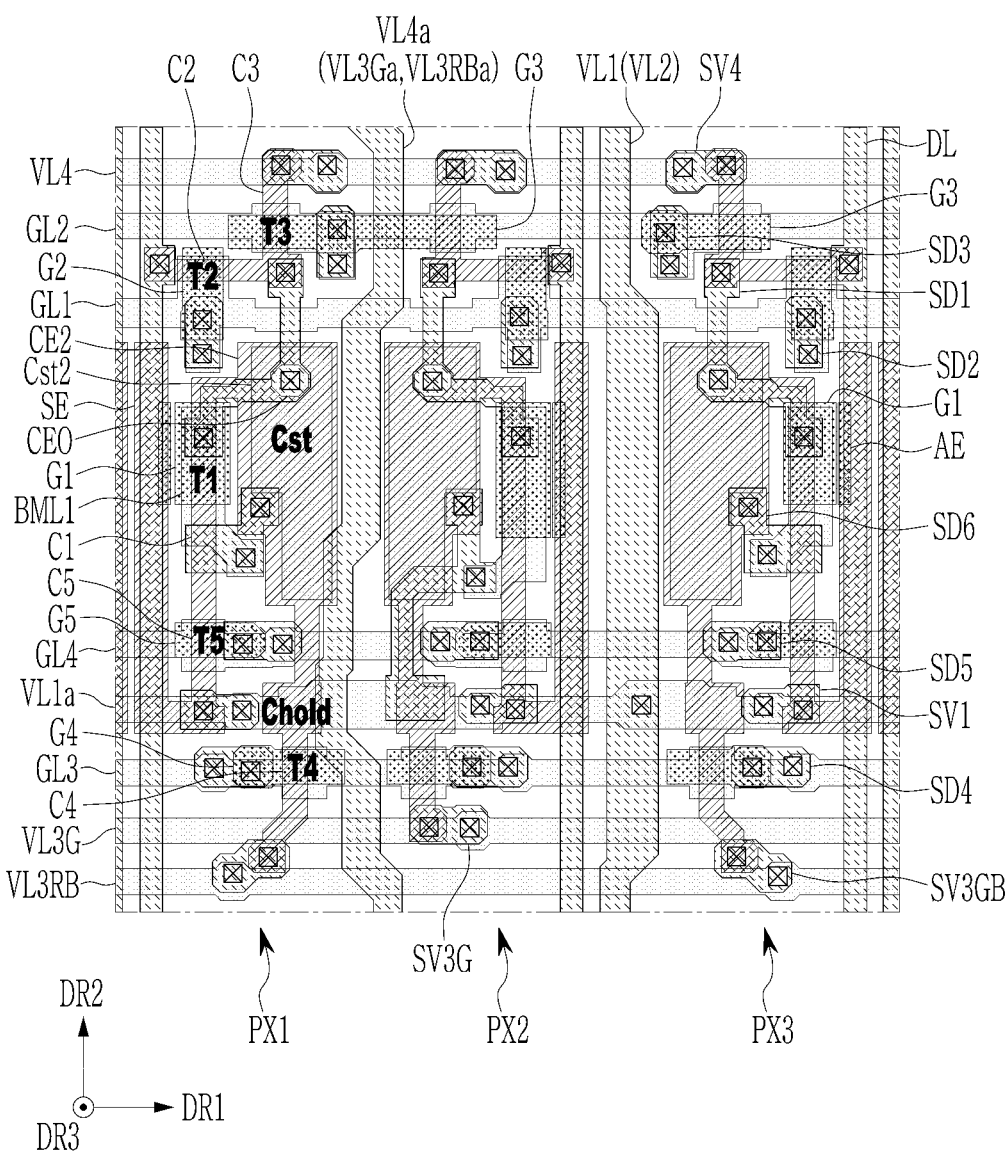
FIG. 3 illustrates a top plan view of a pixel area of a light-emitting display device according to one or more embodiments.
Figure 4:
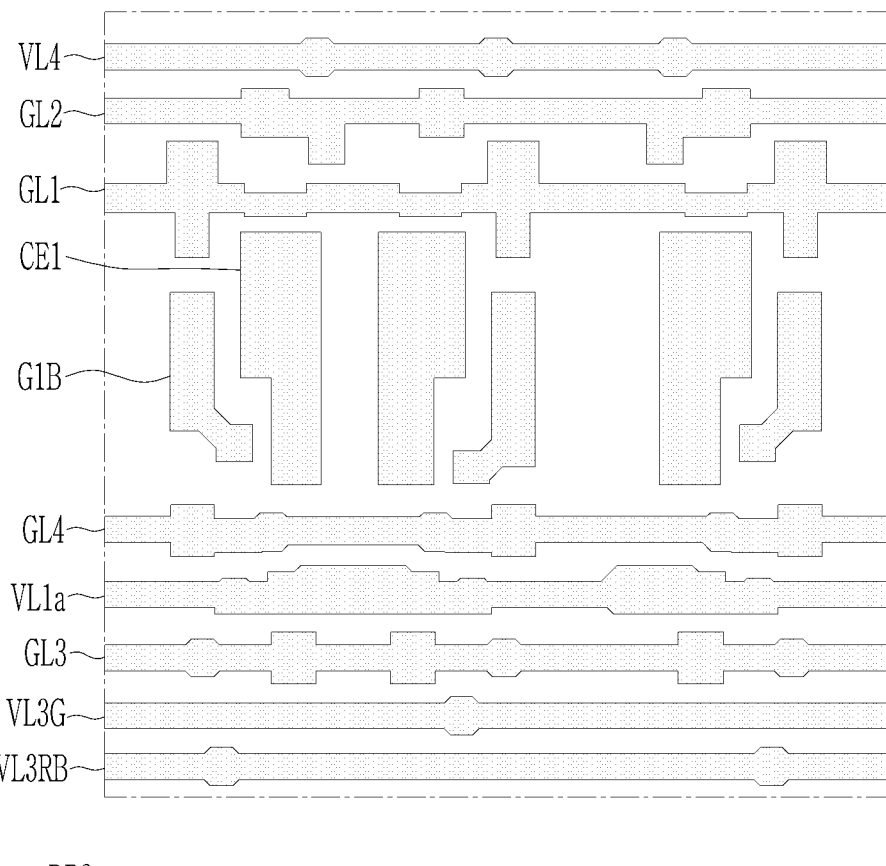
FIG. 4, FIG. 5, and FIG. 6 respectively illustrate a top plan view according to a manufacturing sequence of the light-emitting display device illustrated in FIG. 3.
Figure 4:
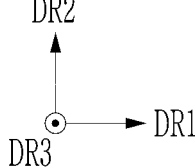
Figure 5:
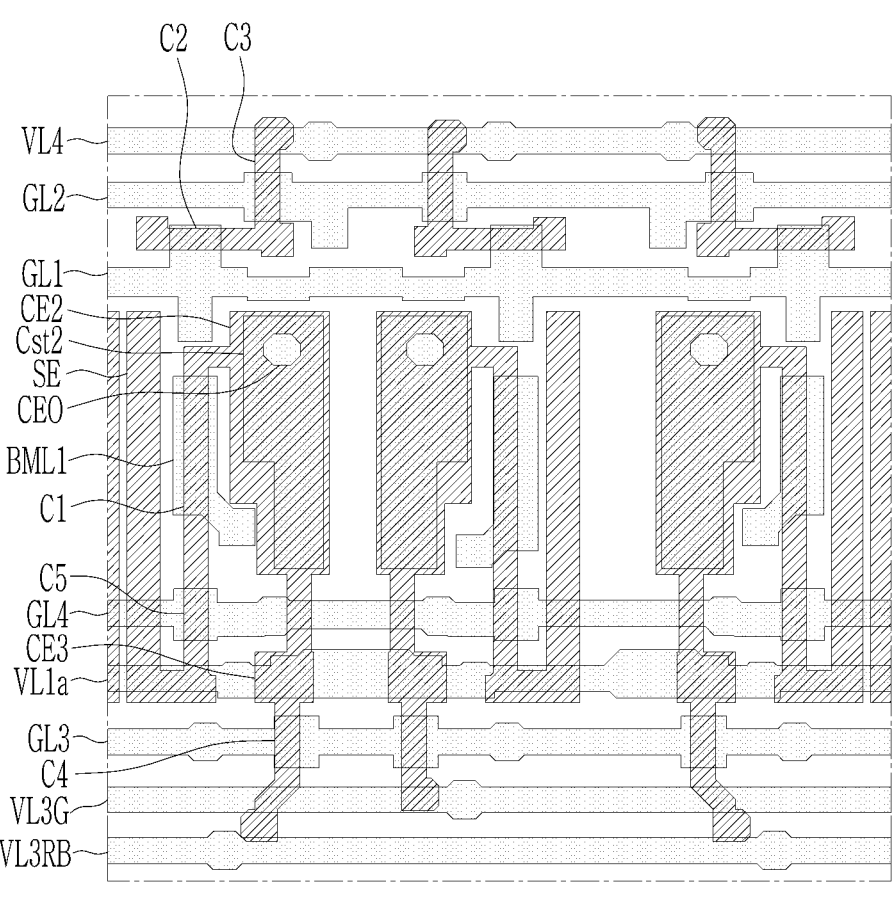
Figure 5:
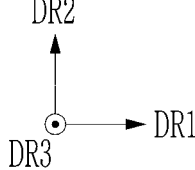
Figure 6:
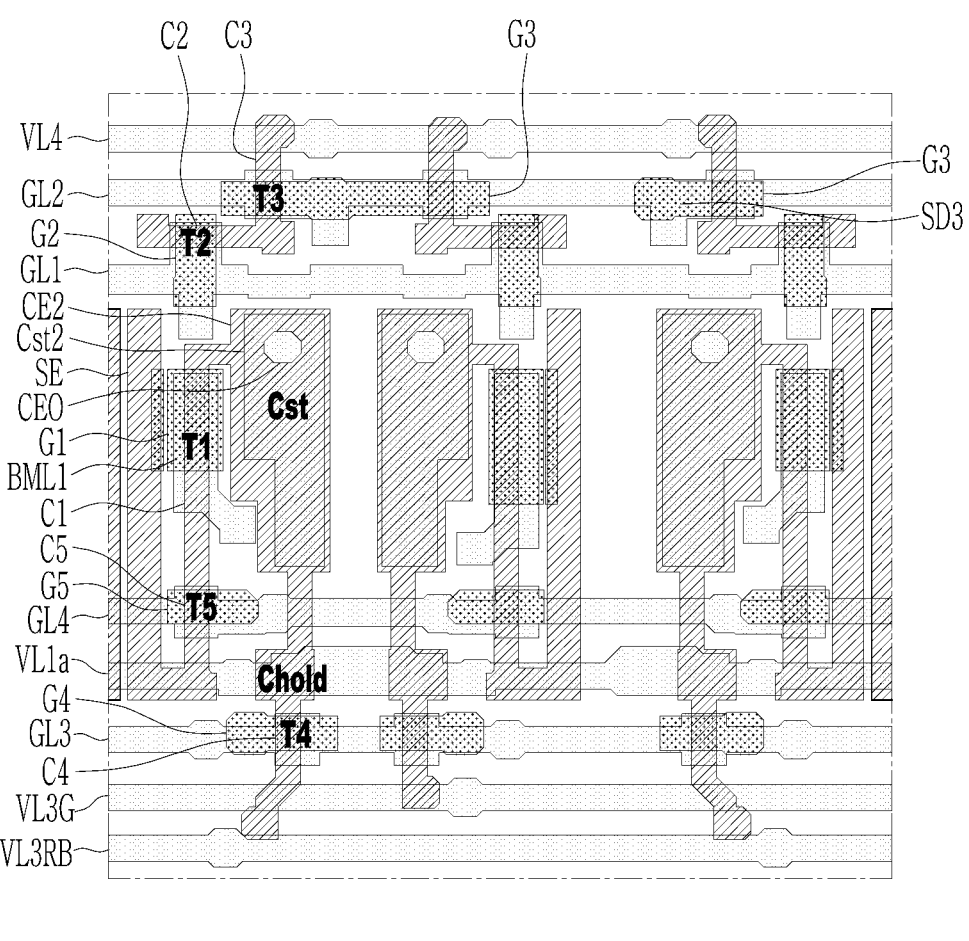
Figure 6:
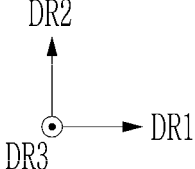
Figure 7:
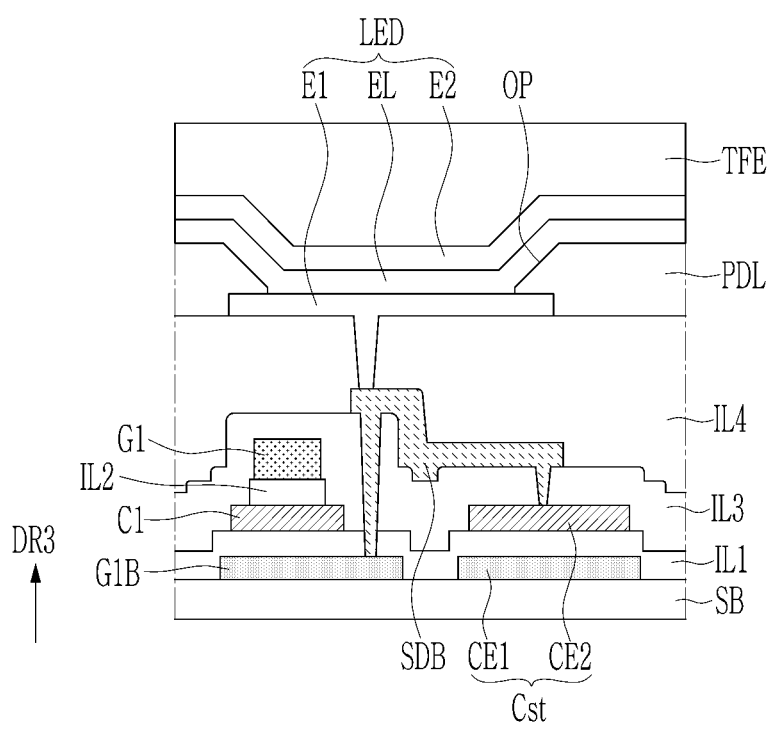
FIG. 7 illustrates a schematic cross-sectional view of a light-emitting display device according to one or more embodiments.

FIG. 3 illustrates a top plan view of a pixel area of a light-emitting display device according to one or more embodiments, and FIG. 4, FIG. 5, and FIG. 6 respectively illustrate a top plan view according to a manufacturing sequence of the light-emitting display device illustrated in FIG. 3. FIG. 7 illustrates a schematic cross-sectional view of a light-emitting display device according to one or more embodiments.

In FIG. 3 to FIG. 6, a pixel area corresponding to substantially three pixels PX is illustrated, and for example, a first pixel PX1, a second pixel PX2, and a third pixel PX3 are located from left to right. The first pixel PX1, the second pixel PX2, and the third pixel PX3 may be a red pixel, a green pixel, and a blue pixel, respectively. In FIG. 3 to FIG. 6, the light-emitting diode LED is not shown, and instead a pixel circuit located thereunder is shown. FIG. 7 schematically illustrates some components for indicating a positional relationship between conductive layers and insulating layers, and may correspond to a schematic cross section of the display portion 100 of the display panel 10 in FIG. 1.

Referring to FIG. 3 to FIG. 7, a first conductive layer that may include first to fourth gate lines GL1 to GL4, an auxiliary driving voltage line VL1a, initialization voltage lines VL3G and VL3RB, a reference voltage line VL4, a lower electrode G1B, and a first storage electrode CE1 may be located on the substrate SB. The first to fourth gate lines GL1 to GL4, the auxiliary driving voltage line VL1a, the initialization voltage lines VL3G and VL3RB, and the reference voltage line VL4 may substantially extend in the first direction DR1.

The initialization voltage lines VL3G and VL3RB may include the first initialization voltage line VL3G for transmitting the initialization voltage Vint applied to the second pixel PX2, and the second initialization voltage line VL3RB for transmitting the initialization voltage Vint applied to the first and third pixels PX1 and PX3. The first initialization voltage line VL3G and the second initialization voltage line VL3RB may transmit the initialization voltages Vint having different levels.

The lower electrode G1B may overlap the first semiconductor C1, for example the channel area of the first transistor T1, and may configure a lower gate electrode of the first transistor T1. The lower electrode G1B may reduce or prevent external light from reaching the channel area of the first transistor T1. Accordingly, the leakage current of the first transistor T1 may be reduced.

The substrate SB may include a material having a rigid characteristic, such as glass, or a material having a flexible characteristic, such as plastic. For example, the substrate SB may be a glass substrate. The substrate SB may include a polymer material, such as polyimide, polyamide, or polyethylene terephthalate. The first conductive layer may include a metal, such as copper (Cu), aluminum (Al), titanium (Ti), molybdenum (Mo), or tungsten (W), and may be a single layer or a multilayer. For example, the first conductive layer may have a double-layered structure, such as titanium (Ti)-copper (Cu).

A first insulating layer IL1 may be located on the substrate SB and the first conductive layer. The first insulating layer IL1 may include an inorganic insulating material, such as a silicon nitride ($SiN_x$), a silicon oxide ($SiO_x$), or a silicon oxynitride ($SiO_xN_y$). The first insulating layer IL1 may be referred to as a buffer layer.

A semiconductor layer that may include first to fifth semiconductors C1 to C5 may be located on the first insulating layer IL1. The first to fifth semiconductors C1 to C5 may include channel areas of the first to fifth transistors T1 to T5, respectively. The semiconductor layer may further include a second storage electrode CE2, a second hold electrode CE3, and a shielding electrode SE.

One end and the other end of the first semiconductor C1 may be connected to the second storage electrode CE2 and the fifth semiconductor C5, respectively. One end and the other end of the second semiconductor C2 may be connected to the data line DL and the third semiconductor C3, respectively. One end and the other end of the third semiconductor C3 may be connected to the reference voltage line VL4 and the second semiconductor C2, respectively. One end and the other end of the fourth semiconductor C4 may be connected to the initialization voltage line VL3 and the second hold electrode CE3, respectively. One end and the other end of the fifth semiconductor C5 may be connected to the auxiliary driving voltage line VL1a and the first semiconductor C1, respectively. One end of the shielding electrode SE may be connected to the fifth semiconductor C5 and the auxiliary driving voltage line VL1a. The second semiconductor C2 and the third semiconductor C3 may be integrally formed. The shielding electrode SE, the fifth semiconductor C5, the first semiconductor C1, the second storage electrode CE2, the second hold electrode CE3, and the fourth semiconductor C4 may be integrally formed. The shielding electrode SE may be located between the first gate line GL1 and the third gate line GL3 in the second direction DR2. The second storage electrode CE2 may overlap the first storage electrode CE1 to form the storage capacitor Cst together with the first storage electrode CE1. The second hold electrode CE3 may overlap the auxiliary driving voltage line VL1a. A portion of the auxiliary driving voltage line VL1a overlapping the second hold electrode CE3 may function as the first hold electrode, and may configure the hold capacitor Chold together with the second hold electrode CE3.

The semiconductor layer may include an oxide semiconductor. For example, the semiconductor layer may include oxide semiconductors, such as an indium-gallium-zinc oxide (IGZO) containing at least one of zinc (Zn), indium (In), gallium (Ga), tin (Sn), and a mixture thereof.

A second insulating layer IL2 may be located on the semiconductor layer. The second insulating layer IL2 may be located in an area overlapping first to fifth gate electrodes G1 to G5 and an auxiliary electrode AE. Alternatively, the second insulating layer IL2 may be formed to substantially cover the entire substrate SB. The second insulating layer IL2 may be an inorganic insulating layer including an inorganic insulating material, such as a silicon oxide, a silicon nitride, or a silicon oxynitride, and may be a single layer or a multilayer. The second insulating layer IL2 may be referred to as a gate insulating layer.

A second conductive layer including the first to fifth gate electrodes G1 to G5 and the auxiliary electrodes AE may be located on the second insulating layer IL2. The first gate electrode G1 may overlap the first semiconductor C1 and the lower electrode G1B. The second gate electrode G2 may overlap the second semiconductor C2 and the first gate line GL1. The third gate electrode G3 may overlap the third semiconductor C3 and the second gate line GL2. The fourth gate electrode G4 may overlap the fourth semiconductor C4 and the third gate line GL3. The fifth gate electrode G5 may overlap the fifth semiconductor C5 and the fourth gate line GL4. In the first to fifth semiconductors C1 to C5, portions overlapping the first to fifth gate electrodes G1 to G5 may be channel areas of the first to fifth transistors T1 to T5.

The auxiliary electrode AE may be adjacent to the first gate electrode G1. The auxiliary electrode AE may at least partially overlap the shielding electrode SE. The auxiliary electrode AE may be in an electrically floating state. The auxiliary electrode AE may overlap the first gate electrode G1 in the first direction DR1 (e.g., may be aligned with the first gate electrode G1 in the first direction DR1). A length of the auxiliary electrode AE may be equal to or greater than a length of the first gate electrode G1. The auxiliary electrode AE may reduce the parasitic capacitance between the first gate electrode G1 and the data line DL and the parasitic capacitance between the first gate electrode G1 and the shielding electrode SE. The second conductive layer may include a metal, such as copper (Cu), aluminum (Al), titanium (Ti), molybdenum (Mo), or tungsten (W), and may be a single layer or a multilayer. For example, the second conductive layer may have a double-layered structure, such as titanium (Ti)-copper (Cu).

After the second conductive layer is formed, portions of the semiconductor layer that are not covered with the second conductive layer may be doped through plasma treatment or doping treatment. As a result, the portions of the semiconductor layer not covered with the second conductive layer may become conductive, and the portions of the semiconductor layer covered with the second conductive layer may become channel areas.

A third insulating layer IL3 may be located on the second conductive layer. The third insulating layer IL3 may be an inorganic insulating layer including an inorganic insulating material, such as a silicon oxide, a silicon nitride, or a silicon oxynitride, and may be a single layer or a multilayer. The third insulating layer IL3 may be referred to as an interlayer insulating layer.

A third conductive layer that may include the data line DL, the driving voltage line VL1, and the auxiliary reference voltage line VL4a may be located on the third insulating layer IL3. The data line DL, the driving voltage line VL1, and the auxiliary reference voltage line VL4a may substantially extend in the second direction DR2. The third conductive layer may further include connecting members SD1, SD2, SD3, SD4, SD5, SDB, SV1, SV3G, SV3RB, and SV4.

The data line DL may be connected to the second semiconductor C2 through a contact hole formed in the third insulating layer IL3. The data line DL may overlap the shielding electrode SE. The shielding electrode SE may be located under the data line DL to shield the voltage of other portions of the pixel PX from being varied even when the data voltage Vdata transmitted through the data line DL varies. A width of the shielding electrode SE may be greater than a width of the data line DL.

The driving voltage line VL1 may be connected to the auxiliary driving voltage line VL1a through a contact hole formed in the first and third insulating layers IL1 and IL3. Accordingly, the driving voltage line VL1 and the auxiliary driving voltage line VL1a may be located in a mesh form, and the driving voltage ELVdd of a substantially uniform level may be transmitted throughout the display area DA. The auxiliary driving voltage line VL1a may be electrically connected to the fifth semiconductor C5 through the connecting member SV1. Because the shielding electrode SE is connected to the fifth semiconductor C5, the driving voltage ELVdd may be applied to the shielding electrode SE. A DC voltage (for example, the common voltage ELVss) other than the driving voltage ELVdd may be applied to the shielding electrode SE. The common voltage line VL2 transmitting the common voltage ELVss may be located at a position of the driving voltage line VL1, and the driving voltage line VL1 and the common voltage line VL2 may be alternately located along the first direction DR1.

The auxiliary reference voltage line VL4a may be connected to the reference voltage line VL4 through a contact hole formed in the first and third insulating layers IL1 and IL3. Accordingly, the reference voltage line VL4 and the auxiliary reference voltage line VL4a may be located in a mesh shape, and the reference voltage Vref of a substantially uniform level may be transmitted throughout the display area DA. The reference voltage line VL4 may be electrically connected to the third semiconductor C3 by the connecting member SV4. A first auxiliary initialization voltage line VL3Ga for transmitting the initialization voltage Vint applied to the second pixel PX2 may be located at the position of the auxiliary reference voltage line VL4a to be connected to the first initialization voltage line VL3G, or a second auxiliary initialization voltage line VL3RBa for transmitting the initialization voltage Vint applied to the first and third pixels PX1 and PX3 may be located thereat to be connected to the second initialization voltage line VL3RB. The auxiliary reference voltage line VL4a, the first auxiliary initialization voltage line VL3Ga, and/or the second auxiliary initialization voltage line VL3RBa may be alternately located along the first direction DR1.

The connecting member SD1 may be connected to the second semiconductor C2 and the first gate electrode G1 through contact holes formed in the third insulating layer IL3, and may be connected to the first storage electrode CE1 through a contact hole formed in the first and third insulating layers IL1 and IL3. The second storage electrode CE2 may include an opening CEO so that the connecting member SD1 may be connected to the first storage electrode CE1. The first gate electrode G1, the first storage electrode CE1, and the second electrode of the second transistor T2 may be electrically connected by the connecting member SD1.

The connecting member SD2 may be connected to the second gate electrode G2 through a contact hole formed in the third insulating layer IL3, and may be connected to the first gate line GL1 through a contact hole formed in the first and third insulating layers IL1 and IL3. The second gate electrode G2 may be electrically connected to the first gate line GL1 by the connecting member SD2.

The connecting member SD3 may be connected to the third gate electrode G3 through a contact hole formed in the third insulating layer IL3, and may be connected to the second gate line GL2 through a contact hole formed in the first and third insulating layers IL1 and IL3. The third gate electrode G3 may be electrically connected to the second gate line GL2 by the connecting member SD3.

The connecting member SD4 may be connected to the fourth gate electrode G4 through a contact hole formed in the third insulating layer IL3, and may be connected to the third gate line GL3 through a contact hole formed in the first and third insulating layers IL1 and IL3. The fourth gate electrode G4 may be electrically connected to the third gate line GL3 by the connecting member SD4.

The connecting member SD5 may be connected to the fifth gate electrode G5 through a contact hole formed in the third insulating layer IL3, and may be connected to the fourth gate line GL4 through a contact hole formed in the first and third insulating layers IL1 and IL3. The fifth gate electrode G5 may be electrically connected to the fourth gate line GL4 by the connecting member SD5.

The connecting member SDB may be connected to the second storage electrode CE2 through a contact hole formed in the third insulating layer IL3, and may be connected to the lower electrode G1B through a contact hole formed in the first and third insulating layers IL1 and IL3. The second storage electrode CE2 and the lower electrode G1B may be electrically connected by the connecting member SDB. The connecting member SDB may be electrically connected to the second electrode of the first transistor T1 through the second storage electrode CE2.

The connecting member SV3G may be connected to the fourth semiconductor C4 of the second pixel PX2 through a contact hole formed in the third insulating layer IL3, and may be connected to the first initialization voltage line VL3G through a contact hole formed in the first and third insulating layers IL1 and IL3. The connecting member SV3RB may be connected to the first pixel PX1 or the fourth semiconductor C4 of the third pixel PX3 through a contact hole formed in the third insulating layer IL3, and may be connected to the second initialization voltage line VL3RB through a contact hole formed in the first and third insulating layers IL1 and IL3. The first electrode of the fourth transistor T4 may be electrically connected to the initialization voltage lines VL3G and VL3RB by the connecting members SV3G and SV3RB.

The third conductive layer may include a metal, such as copper (Cu), aluminum (Al), titanium (Ti), molybdenum (Mo), or tungsten (W), and may be a single layer or a multilayer.

A fourth insulating layer IL4 may be located on the third conductive layer. The fourth insulating layer IL4 may include an organic insulating material, such as a general purpose polymer, such as poly(methyl methacrylate) and polystyrene, a polymer derivative having a phenol-based group, an acryl-based polymer, an imide-based polymer, a polyimide, or a siloxane-based polymer. The fourth insulating layer IL4 may be referred to as a planarization layer.

A first electrode E1 of the light-emitting diode LED may be located on the fourth insulating layer IL4. The first electrode E1 may be connected to the connecting member SDB through a contact hole formed in the fourth insulating layer IL4. Because the connecting member SDB is electrically connected to the second electrode of the first transistor T1, a driving current outputted from the first transistor T1 may be transmitted to the first electrode E1. The first electrode E1 may be referred to as a pixel electrode. The first electrode E1 may be made of a reflective conductive material or a translucent conductive material, or it may be made of a transparent conductive material. The first electrode E1 may include a transparent conductive material, such as an indium tin oxide (ITO) or an indium zinc oxide (IZO). The first electrode E1 may include a metal, such as lithium (Li), calcium (Ca), aluminum (Al), silver (Ag), magnesium (Mg), or gold (Au). The first electrode E1 may have a multi-layered structure, such as, for example, may have a triple-layered structure, such as ITO-silver (Ag)-ITO.

A pixel defining layer PDL having an opening OP over-lapping the first electrode E1 may be located on the first electrode E1. The pixel defining layer PDL may include an organic insulating material, such as an acryl-based polymer, an imide-based polymer, or an amide-based polymer.

A light-emitting layer EL may be located on the first electrode E1. The light-emitting layer EL may be located across the pixels or may be individually located for each pixel. The light-emitting layer EL may include a light-emitting material emitting blue light. The light-emitting layer EL may include a light-emitting material that emits red light or green light in addition to blue light. The light-emitting layer EL may include a plurality of light-emitting layers, and the plurality of light-emitting layers may include light-emitting layers emitting light of the same color or light-emitting layers emitting light of different colors. For example, the light-emitting layer EL may have a structure in which three blue light-emitting layers are stacked. As another example, the light-emitting layer EL may have a structure in which three blue light-emitting layers and one green light-emitting layer are stacked. A functional layer including at least one of a hole injection layer, a hole transport layer, an electron transport layer, and an electron injection layer may be located on the first electrode E1 in addition to the light-emitting layer EL.

A second electrode E2 may be located on the light-emitting layer EL. The second electrode E2 may be located across the pixels. The second electrode E2 may be continu-ously located on the entire display area DA. The second electrode E2 may be connected to the common voltage line VL2 through a connection electrode that may be located as a same layer as the first electrode E1, and may receive the common voltage ELVss. The second electrode E2 may be referred to as a common electrode. The second electrode E2 may include a metal, such as calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), and lithium (Li). The second electrode E2 may include a transparent conductive oxide, such as an indium tin oxide (ITO) or an indium zinc oxide (IZO). The second electrode E2 may have a multi-layered structure, and for example, may have a double-layered structure, such as magnesium (Mg)-silver (Ag).

The first electrode E1, the light-emitting layer EL, and the second electrode E2 may configure the light-emitting diode LED, which may be an organic light-emitting diode. The first electrode E1 may be individually provided for each pixel to receive the driving current. The second electrode E2 may be commonly provided to the pixels to receive the common voltage ELVss. The first electrode E1 may be an anode that is a hole injection electrode and the second electrode E2 may be a cathode that is an electron injection electrode, and vice versa. The opening OP of the pixel defining layer PDL may correspond to the light-emitting area of the light-emitting diode LED.

An encapsulation layer TFE may be located on the second electrode E2. The encapsulation layer TFE may seal the light-emitting diodes LED, and may reduce or prevent moisture or oxygen from penetrating from the outside. The encapsulation layer TFE may have a multilayer structure, and for example, may have a triple-layered structure, such as an inorganic layer-organic layer-inorganic layer. Meanwhile, the color-converting portion 200 described with reference to FIG. 1 may be located on the encapsulation layer TFE.

Figure 8:
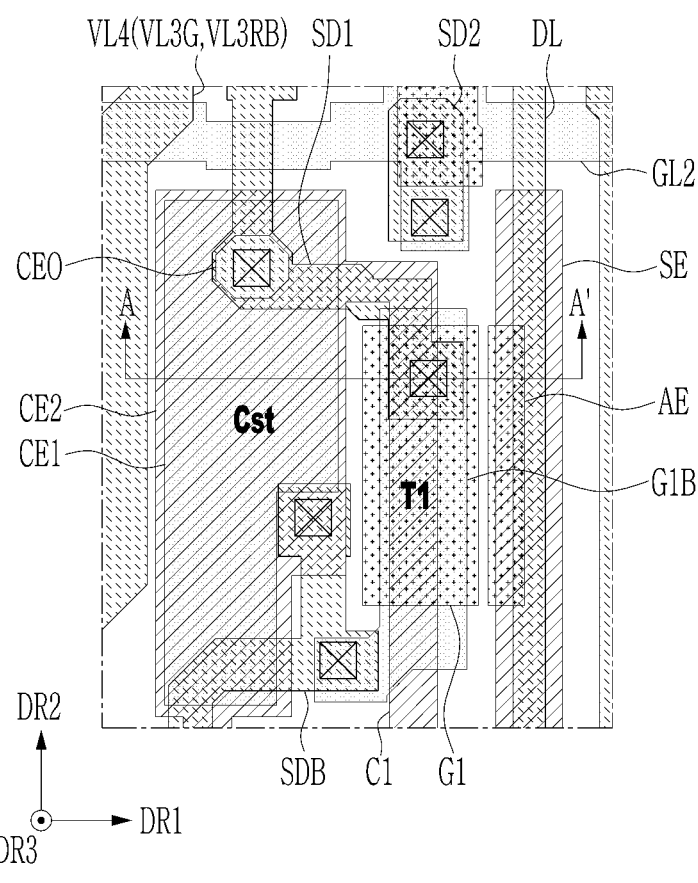
FIG. 8 illustrates an enlarged top plan view of a vicinity where an auxiliary electrode is located in FIG. 3.
Figure 9:
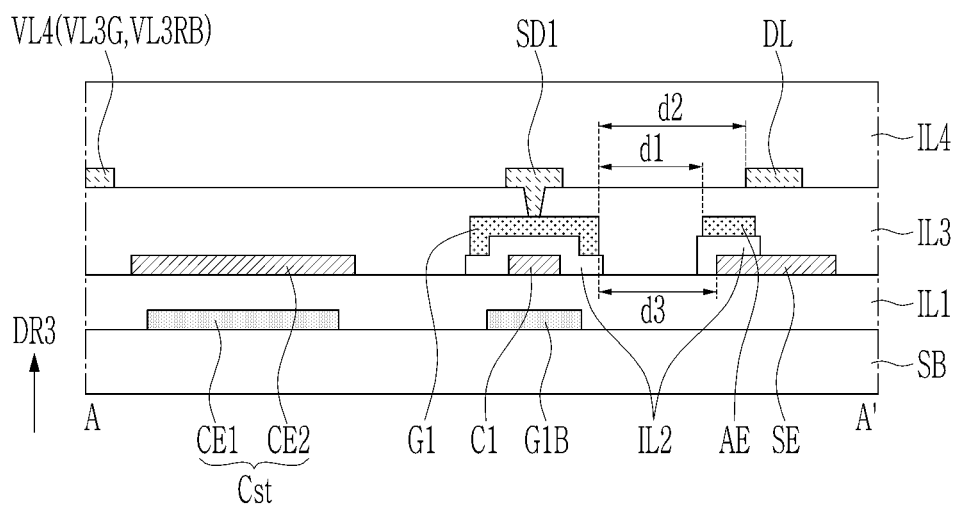
FIG. 9 illustrates a cross-sectional view taken along the line A-A' of FIG. 8.

FIG. 8 illustrates an enlarged top plan view of a vicinity where an auxiliary electrode is located in FIG. 3, and FIG. 9 illustrates a schematic cross-sectional view of one or more embodiments taken along the line A-A' of FIG. 8. In FIG. 9, the constituent elements located on the fourth insulating layer IL4 in FIG. 7 are not shown.

Referring to FIG. 8 and FIG. 9, the auxiliary electrode AE may be located between the shielding electrode SE and the data line DL (e.g., in a thickness direction/third direction DR3). The auxiliary electrode AE may be in an electrically floating state. That is, the auxiliary electrode AE may be an island electrode that is insulated without being connected to another conductor to which a voltage is applied. The aux-iliary electrode AE may be biased toward the first gate electrode G1 with respect to a central line of the data line DL with respect to the second direction DR2. Similarly, the auxiliary electrode AE may be biased toward the first gate electrode G1 with respect to a central line of the second direction DR2 of the shielding electrode SE. At least a portion of the auxiliary electrode AE may be located between the data line DL and the first gate electrode G1 (e.g., in plan view). Accordingly, bypass capacitance is formed between the shield electrode SE and the data line DL at the opposite side of the first gate electrode G1, so that parasitic capacitance between the data line DL and the first gate electrode G1 may be reduced.

The auxiliary electrode AE may include a portion over-lapping the data line DL and a portion not overlapping the data line (e.g., in the third direction DR3). The auxiliary electrode AE might not overlap the central line of the data line DL with respect to the second direction DR2. In a plan view, a distance d1 between the auxiliary electrode AE and the first gate electrode G1 may be less than a distance d2 between the data line DL and the first gate electrode G1. That is, the auxiliary electrode AE may protrude from the data line DL toward the first gate electrode G1. That is, a portion of the auxiliary electrode AE that does not overlap the data line DL may be located between the data line DL and the first gate electrode G1 in plan view. Accordingly, the auxiliary electrode AE may reduce coupling between the data line DL and the first gate electrode G1, and may reduce parasitic capacitance between the data line DL and the first gate electrode G1. Meanwhile, in a cross-sectional view, a distance between the auxiliary electrode AE and the first gate electrode G1 may be less than a distance between the data line DL and the first gate electrode G1.

The auxiliary electrode AE may not overlap the central line of the shielding electrode SE with respect to the second direction DR2. In a plan view, the distance d1 between the auxiliary electrode AE and the first gate electrode G1 may be less than a distance d3 between the shielding electrode SE and the first gate electrode G1. That is, the auxiliary elec-trode AE may protrude from the shielding electrode SE toward the first gate electrode G1 in plan view. A portion of the auxiliary electrode AE that does not overlap the shield-ing electrode SE may be located between the shielding electrode SE and the first gate electrode G1. Accordingly, the auxiliary electrode AE may reduce coupling between the shielding electrode SE and the first gate electrode G1, and may reduce parasitic capacitance between the shielding electrode SE and the first gate electrode G1. Meanwhile, in a cross-sectional view, a distance between the auxiliary electrode AE and the first gate electrode G1 may be less than a distance between the shielding electrode SE and the first gate electrode G1.

The auxiliary electrode AE may be made of the same material as, and in the same process as, the first gate electrode G1. For example, a metal layer may be formed on the second insulating layer IL2 and then patterned to form the second conductive layer including the first gate electrode G1, the auxiliary electrode AE, and the like. The auxiliary electrode AE may be formed of a conductive layer that is different from that of the first gate electrode G1. The auxiliary electrode AE may be formed of a conductive layer that may be located between the shielding electrode SE and the data line DL.

The first transistor T1 including an oxide semiconductor as the first semiconductor C1 may be significantly affected by parasitic capacitance due to a relatively large change in the threshold voltage Vth. Because the data voltage Vdata transmitted through the data line DL is not constant and fluctuates, the change in the gate voltage of the first transistor T1 due to the parasitic capacitance between the first transistor T1 and the data line DL may affect the driving current outputted from the first transistor T1. Accordingly, display quality may be deteriorated, for example, stains may occur in an image displayed in a low grayscale. By forming and arranging the auxiliary electrode AE in the manner described, the parasitic capacitance that affects the operation of the first transistor T1 may be reduced, thereby improving display quality.

Figure 10:
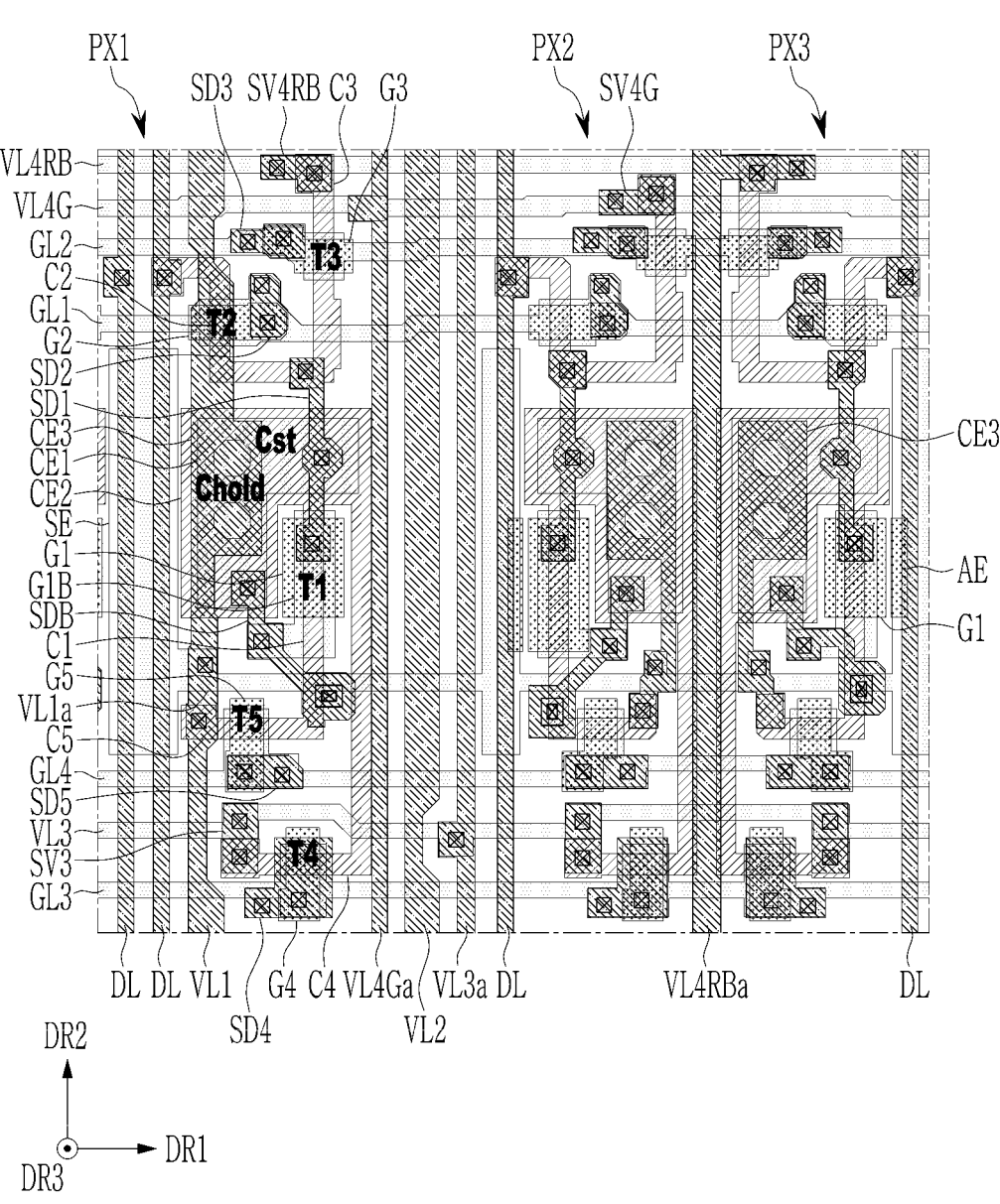
FIG. 10 illustrates a top plan view of a pixel area of a light-emitting display device according to one or more embodiments.
Figure 11:
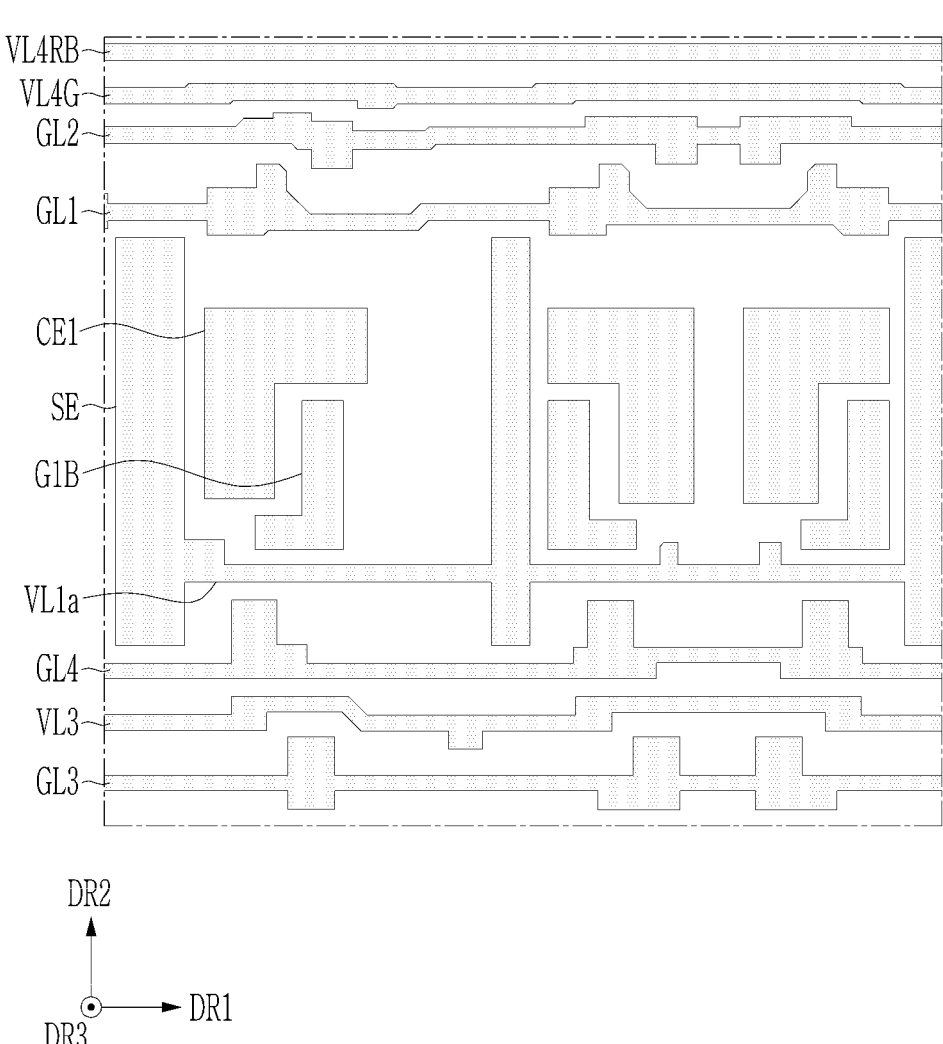
FIG. 11, FIG. 12, and FIG. 13 respectively illustrate a top plan view according to a manufacturing sequence of the light-emitting display device illustrated in FIG. 10.
Figure 12:
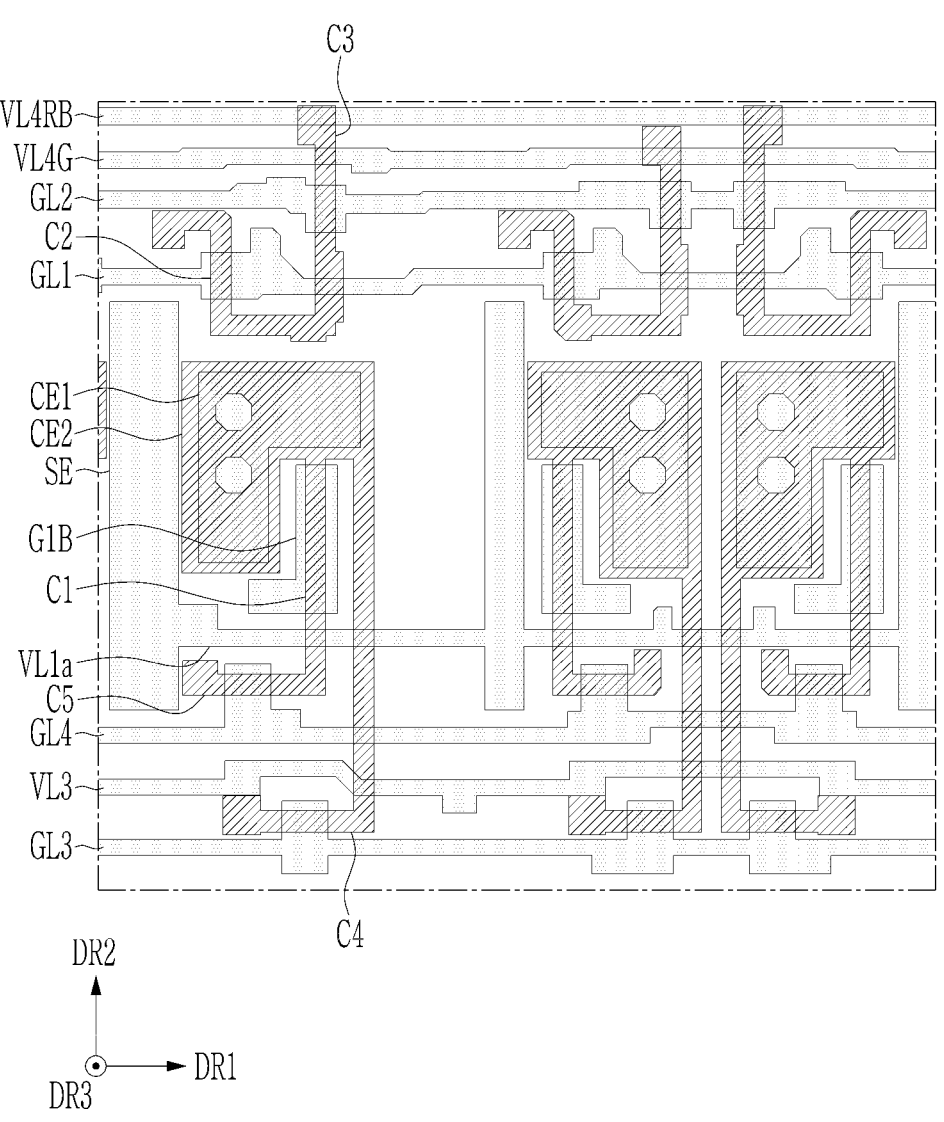
Figure 13:
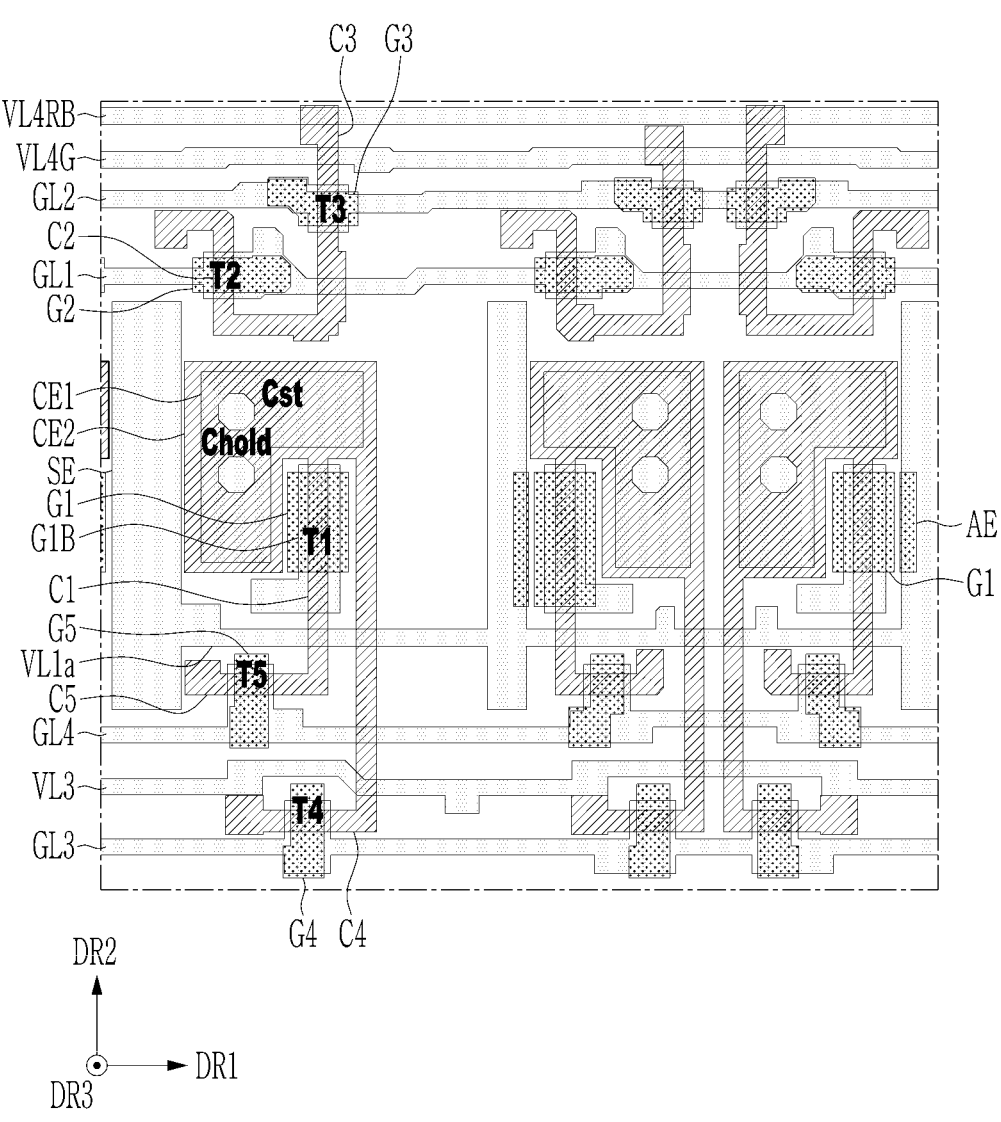
Figure 14:
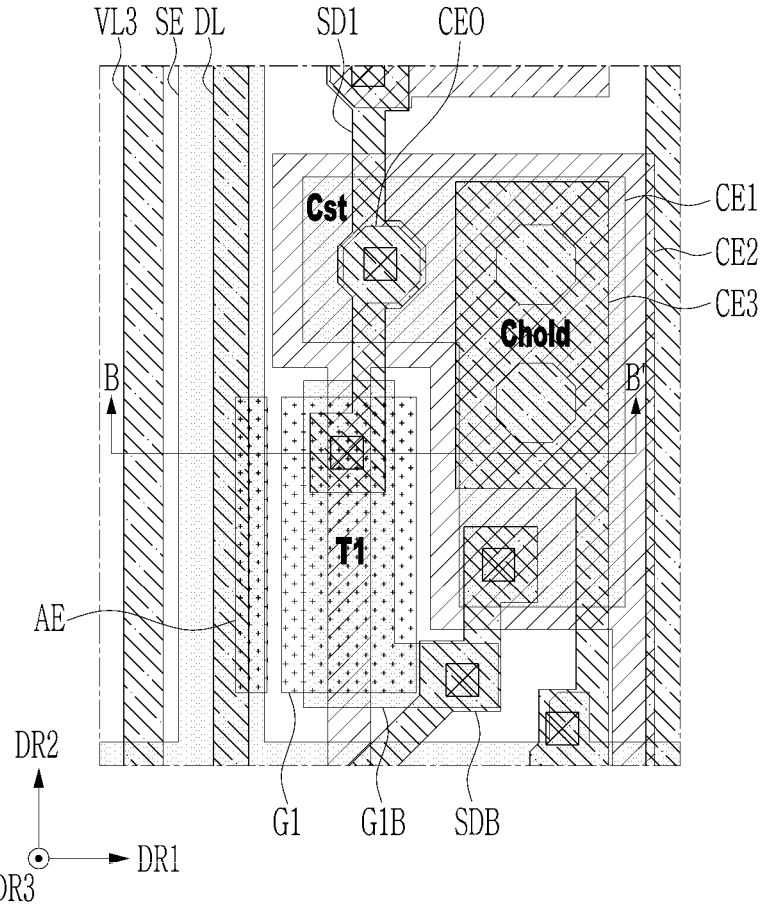
FIG. 14 illustrates an enlarged top plan view of a vicinity where an auxiliary electrode is located in FIG. 10.
Figure 15:
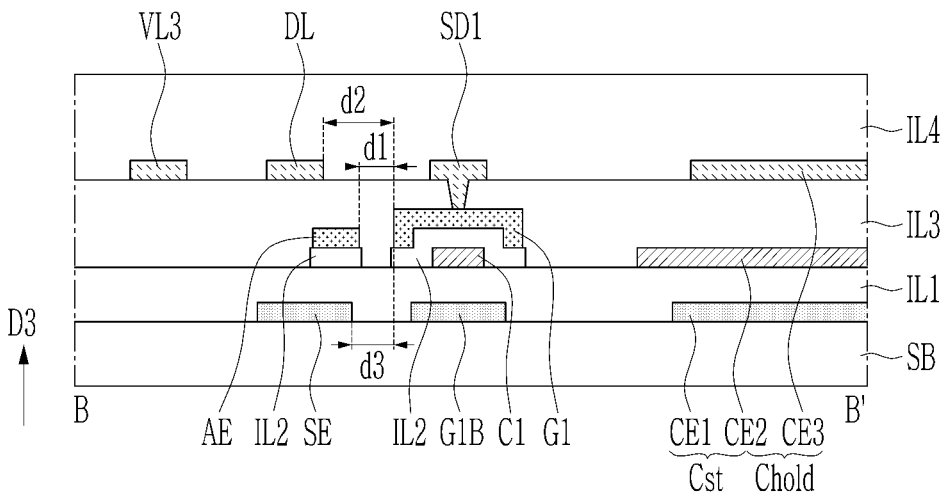
FIG. 15 illustrates a cross-sectional view taken along the line B-B' of FIG. 14.

FIG. 10 illustrates a top plan view of a pixel area of a light-emitting display device according to one or more embodiments, and FIG. 11, FIG. 12, and FIG. 13 respectively illustrate a top plan view according to a manufacturing sequence of the light-emitting display device illustrated in FIG. 10. FIG. 14 illustrates an enlarged top plan view of a vicinity where an auxiliary electrode is located in FIG. 10, and FIG. 15 illustrates a schematic cross-sectional view of one or more embodiments taken along the line B-B' of FIG. 14.

In FIG. 10 to FIG. 13, a pixel area corresponding to substantially three pixels PX is illustrated, and for example, a first pixel PX1, a second pixel PX2, and a third pixel PX3 that may respectively correspond to a red pixel, a green pixel, and a blue pixel are located from left to right. In FIG. 10 to FIG. 13, the light-emitting diode LED is not shown, and a pixel circuit located thereunder is shown. In FIG. 15, the constituent elements located on the fourth insulating layer IL4 in FIG. 7 are not shown. Differences from the above-described embodiments will be mainly described, and the same features (for example, the material, such as the substrate, the insulating layer, the conductive layer, the process feature, and the like) will be omitted or briefly described.

Referring to FIG. 10 to FIG. 15, a first conductive layer that may include first to fourth gate lines GL1 to GL4, an auxiliary driving voltage line VL1a, an initialization voltage line VL3, reference voltage lines VL4G and VL4RB, a lower electrode G1B, a first storage electrode CE1, and a shielding electrode SE may be located on a substrate SB. The first to fourth gate lines GL1 to GL4, the auxiliary driving voltage line VL1a, the initialization voltage line VL3, and the reference voltage lines VL4G and VL4RB may substantially extend in the first direction DR1.

The reference voltage lines VL4G and VL4RB may include the first reference voltage line VL4G for transmitting the reference voltage Vref applied to the second pixel PX2, and the second reference voltage line VL4RB for transmitting the reference voltage Vref applied to the first and third pixels PX1 and PX3. The first reference voltage line VL4G and the second reference voltage line VL4RB may transmit the reference voltages Vref having different levels.

The lower electrode G1B may overlap the first semiconductor C1, for example the channel area of the first transistor T1, and may configure the lower gate electrode of the first transistor T1. The lower electrode G1B may reduce or prevent external light from reaching the channel area of the first transistor T1. Accordingly, the leakage current of the first transistor T1 may be reduced. The shielding electrode SE may be connected to the auxiliary driving voltage line VL1a, and the driving voltage ELVdd may be applied to the shielding electrode SE. The shielding electrode SE may be integrally formed with the auxiliary driving voltage line VL1a. The shielding electrode SE may be located between the first gate line GL1 and the fourth gate line GL4 in the second direction DR2 (e.g., in plan view).

A first insulating layer IL1 may be located on the substrate SB and the first conductive layer.

A semiconductor layer that may include first to fifth semiconductors C1 to C5 may be located on the first insulating layer IL1. The first to fifth semiconductors C1 to C5 may include channel areas of the first to fifth transistors T1 to T5, respectively. The semiconductor layer may further include a second storage electrode CE2.

Ends of the first semiconductor C1 may be connected to the second storage electrode CE2 and the fifth semiconductor C5, respectively. Ends of the second semiconductor C2 may be connected to the data line DL and the third semiconductor C3, respectively. Ends of the third semiconductor C3 may be connected to the reference voltage lines VL4G, VL4RB and the second semiconductor C2, respectively. Ends of the fourth semiconductor C4 may be connected to the initialization voltage line VL3 and the second storage electrode CE2, respectively. Ends of the fifth semiconductor C5 may be connected to the driving voltage line VL1 or the auxiliary driving voltage line VL1a and the first semiconductor C1, respectively. One end of the shielding electrode SE may be connected to the fifth semiconductor C5 and the auxiliary driving voltage line VL1a. The second semiconductor C2 and the third semiconductor C3 may be integrally formed. The fifth semiconductor C5, the first semiconductor C1, the second storage electrode CE2, and the fourth semiconductor C4 may be integrally formed. The second storage electrode CE2 may overlap the first storage electrode CE1 to form the storage capacitor Cst together with the first storage electrode CE1.

The semiconductor layer may include an oxide semiconductor. For example, the semiconductor layer may include oxide semiconductors, such as an indium-gallium-zinc oxide (IGZO) containing at least one of zinc (Zn), indium (In), gallium (Ga), tin (Sn), and a mixture thereof.

A second insulating layer IL2 may be located on the semiconductor layer. The second insulating layer IL2 may be located in an area overlapping first to fifth gate electrodes G1 to G5 and an auxiliary electrode AE. Alternatively, the second insulating layer IL2 may be formed to substantially cover the entire substrate SB.

A second conductive layer including the first to fifth gate electrodes G1 to G5 and the auxiliary electrodes AE may be located on the second insulating layer IL2. The first gate electrode G1 may overlap the first semiconductor C1 and the lower electrode G1B. The second gate electrode G2 may overlap the second semiconductor C2 and the first gate line GL1. The third gate electrode G3 may overlap the third semiconductor C3 and the second gate line GL2. The fourth gate electrode G4 may overlap the fourth semiconductor C4 and the third gate line GL3. The fifth gate electrode G5 may overlap the fifth semiconductor C5 and the fourth gate line GL4. In the first to fifth semiconductors C1 to C5, portions overlapping the first to fifth gate electrodes G1 to G5 may be channel areas of the first to fifth transistors T1 to T5.

The auxiliary electrode AE may be adjacent to the first gate electrode G1. The auxiliary electrode AE may at least partially overlap the shielding electrode SE. The auxiliary electrode AE may be in an electrically floating state. That is, the auxiliary electrode AE may be an island electrode that is insulated without being connected to another conductor to which a voltage is applied. The auxiliary electrode AE may reduce the parasitic capacitance between the first gate electrode G1 and the data line DL along with the parasitic capacitance between the first gate electrode G1 and the shielding electrode SE.

The auxiliary electrode AE may be located between the shielding electrode SE and the data line DL. The auxiliary electrode AE may be biased toward the first gate electrode G1 with respect to a central line of the data line DL with respect to the second direction DR2. The auxiliary electrode AE may be biased toward the first gate electrode G1 with respect to a central line of the shielding electrode SE with respect to the second direction DR2. Accordingly, bypass capacitance is formed between the shield electrode SE and the data line DL at the opposite side of the first gate electrode G1, so that parasitic capacitance between the data line DL and the first gate electrode G1 may be reduced.

The auxiliary electrode AE may include a portion overlapping the data line DL and a portion not overlapping the data line DL. The auxiliary electrode AE may not overlap the central line of the second direction DR2 of the data line DL. In a plan view, a distance d1 between the auxiliary electrode AE and the first gate electrode G1 (e.g., in plan view) may be less than a distance d2 between the data line DL and the first gate electrode G1 (e.g., in plan view). That is, the auxiliary electrode AE may protrude from the data line DL toward the first gate electrode G1. Accordingly, the auxiliary electrode AE may reduce coupling between the data line DL and the first gate electrode G1, and may reduce parasitic capacitance between the data line DL and the first gate electrode G1. Meanwhile, in a cross-sectional view, a distance between the auxiliary electrode AE and the first gate electrode G1 may be less than a distance between the data line DL and the first gate electrode G1.

The auxiliary electrode AE may not overlap the central line of the shielding electrode SE with respect to the second direction DR2. In a plan view, the distance d1 between the auxiliary electrode AE and the first gate electrode G1 (e.g., in plan view) may be less than a distance d3 between the shielding electrode SE and the first gate electrode G1 (e.g., in plan view). That is, the auxiliary electrode AE may protrude from the shielding electrode SE toward the first gate electrode G1. Accordingly, the auxiliary electrode AE may reduce coupling between the shielding electrode SE and the first gate electrode G1, and may reduce parasitic capacitance between the shielding electrode SE and the first gate electrode G1. Meanwhile, in a cross-sectional view, a distance between the auxiliary electrode AE and the first gate electrode G1 may be less than a distance between the shielding electrode SE and the first gate electrode G1.

The auxiliary electrode AE may be made of the same material as, and in the same process as, the first gate electrode G1. For example, a metal layer may be formed on the second insulating layer IL2, and then may be patterned to form the second conductive layer including the first gate electrode G1, the auxiliary electrode AE, and the like. The auxiliary electrode AE may be formed of a conductive layer that is different from that of the first gate electrode G1. The auxiliary electrode AE may be formed of a conductive layer that may be located between the shielding electrode SE and the data line DL. By forming and arranging the auxiliary electrode AE as described, the parasitic capacitance that affects the operation of the first transistor T1 may be reduced, thereby improving display quality.

In the illustrated embodiments, the auxiliary electrode AE is located in the second pixel PX2 and the third pixel PX3, but is not located in the first pixel PX1. This is because, in the first pixel PX1, the first gate electrode G1 is located relatively far from the data line DL, and the second storage electrode CE2 is located between the first gate electrode G1 and the data line DL.

A third conductive layer that may include the data line DL, the driving voltage line VL1, the common voltage line VL2, the auxiliary initialization voltage line VL3a, the auxiliary reference voltage lines VL4Ga and VL4RBa, and the second hold electrode CE3 may be located on the third insulating layer IL3. The data line DL, the driving voltage line VL1, the common voltage line VL2, the auxiliary initialization voltage line VL3a, and the auxiliary reference voltage lines VL4Ga and VL4RBa may substantially extend in the second direction DR2. The third conductive layer may further include the connecting members SD1, SD2, SD3, SD4, SD5, SDB, SV3, SV4G, and SV4RB.

The data line DL may be connected to the second semiconductor C2 through a contact hole formed in the third insulating layer IL3. The data line DL may overlap the shielding electrode SE. A width of the shielding electrode SE may be greater than a width of the data line DL.

The driving voltage line VL1 may be connected to the auxiliary driving voltage line VL1a through a contact hole formed in the first and third insulating layers IL1 and IL3. Accordingly, the driving voltage line VL1 and the auxiliary driving voltage line VL1a may be located in a mesh form, and the driving voltage ELVdd of a substantially uniform level may be transmitted throughout the display area DA. In the first pixel PX1, the driving voltage line VL1 may be connected to the fifth semiconductor C5 through a contact hole formed in the third insulating layer IL3. In the second and third pixels PX2 and PX3, the auxiliary driving voltage line VL1a may be electrically connected to the fifth semiconductor C5 by an extension of the second hold electrode CE3.

The second electrode E2 located thereon may be connected to the common voltage line VL2.

The initialization voltage line VL3 may be connected to the auxiliary initialization voltage line VL3a through a contact hole formed in the first and third insulating layers IL1 and IL3. Accordingly, the initialization voltage line VL3 and the auxiliary initialization voltage line VL3a may be located in a mesh form, and the initialization voltage Vint of a substantially uniform level may be transmitted throughout the display area DA.

The auxiliary reference voltage lines VL4Ga and VL4RBa may include the first auxiliary reference voltage line VL4Ga for transmitting the reference voltage Vref applied to the second pixel PX2, and the second auxiliary reference voltage line VL4RBa for transmitting the reference voltage Vref applied to the first and third pixels PX1 and PX3. The first auxiliary reference voltage line VL4Ga may be connected to the first reference voltage line VL4G through a contact hole formed in the first and third insulating layers IL1 and IL3. The second auxiliary reference voltage line VL4RBa may be connected to the second reference voltage line VL4RB through a contact hole formed in the first and third insulating layers IL1 and IL3. Accordingly, the reference voltage lines VL4G and VL4RB and the auxiliary reference voltage lines VL4Ga and VL4RBa may be located in a mesh shape, and the common voltage Vref of a substantially uniform level may be transmitted throughout the display area DA. The reference voltage lines VL4G and VL4RB may be electrically connected to the third semiconductor C3 by connecting members SV4G and SV4RB.

In the second and third pixels PX2 and PX3, the second hold electrode CE3 may overlap the second storage electrode CE2 to configure the hold capacitor Chold together with the second storage electrode CE2. The second storage electrode CE2 may function as the first hold electrode of the hold capacitor Chold. That is, a portion overlapping the second hold electrode CE3 in the second storage electrode CE2 may configure the hold capacitor Chold together with the second hold electrode CE3. The extension of the second hold electrode CE3 may be connected to the auxiliary driving voltage line VL1a through a contact hole formed in the first and third insulating layers IL1 and IL3, and may be connected to the fifth semiconductor C5 through a contact hole formed in the third insulating layer IL3. In the first pixel PX1, the driving voltage line VL1 may function as the second hold electrode CE3 by extending in an area overlapping the second storage electrode CE2.

The connecting member SD1 may be connected to the second semiconductor C2 and the first gate electrode G1 through contact holes formed in the third insulating layer IL3, and may be connected to the first storage electrode CE1 through a contact hole formed in the first and third insulating layers IL1 and IL3. The second storage electrode CE2 may include an opening CEO so that the connecting member SD1 may be connected to the first storage electrode CE1. The first gate electrode G1, the first storage electrode CE1, and the second electrode of the second transistor T2 may be electrically connected by the connecting member SD1.

The connecting member SD2 may be connected to the second gate electrode G2 through a contact hole formed in the third insulating layer IL3, and may be connected to the first gate line GL1 through a contact hole formed in the first and third insulating layers IL1 and IL3. The second gate electrode G2 may be electrically connected to the first gate line GL1 by the connecting member SD2.

The connecting member SD3 may be connected to the third gate electrode G3 through a contact hole formed in the third insulating layer IL3, and may be connected to the second gate line GL2 through a contact hole formed in the first and third insulating layers IL1 and IL3. The third gate electrode G3 may be electrically connected to the second gate line GL2 by the connecting member SD3.

The connecting member SD4 may be connected to the fourth gate electrode G4 through a contact hole formed in the third insulating layer IL3, and may be connected to the third gate line GL3 through a contact hole formed in the first and third insulating layers IL1 and IL3. The fourth gate electrode G4 may be electrically connected to the third gate line GL3 by the connecting member SD4.

The connecting member SD5 may be connected to the fifth gate electrode G5 through a contact hole formed in the third insulating layer IL3, and may be connected to the fourth gate line GL4 through a contact hole formed in the first and third insulating layers IL1 and IL3. The fifth gate electrode G5 may be electrically connected to the fourth gate line GL4 by the connecting member SD5.

The connecting member SDB may be connected to the second storage electrode CE2 through a contact hole formed in the third insulating layer IL3, and may be connected to the lower electrode G1B through a contact hole formed in the first and third insulating layers IL1 and IL3. The second storage electrode CE2 and the lower electrode G1B may be electrically connected by the connecting member SDB. The connecting member SDB may be electrically connected to the second electrode of the first transistor T1 through the second storage electrode CE2.

The connecting member SV4G may be connected to the third semiconductor C3 of the second pixel PX2 through a contact hole formed in the third insulating layer, and may be connected to the first reference voltage line VL4G through a contact hole formed in the first and third insulating layers IL1 and IL3. The connecting member SV4RB may be connected to the first pixel PX1 or the third semiconductor C3 of the third pixel PX3 through a contact hole formed in the third insulating layer, and may be connected to the second reference voltage line VL4RB through a contact hole formed in the first and third insulating layers IL1 and IL3. The first electrode of the third transistor T3 may be electrically connected to the reference voltage lines VL4G and VL4RB by the connecting members SV4G and SV4RB.

The connecting member SV3 may be connected to the fourth semiconductor C4 through a contact hole formed in the third insulating layer IL3, and may be connected to the initialization voltage line VL3 through a contact hole formed in the first and third insulating layers IL1 and IL3. The first electrode of the fourth transistor T4 may be electrically connected to the initialization voltage line VL3 by the connecting member SV3.

The fourth insulating layer IL4 may be located on the third conductive layer, and other constituent elements of the display device including the aforementioned light-emitting diode LED and the like may be further located on the fourth insulating layer IL4.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims, with functional equivalents thereof to be included therein.

What is claimed is:

1. A light-emitting display device comprising:
   a substrate;
   a first transistor comprising a lower electrode above the substrate, a first semiconductor overlapping the lower electrode, and a first gate electrode overlapping the first semiconductor;
   a light-emitting diode electrically connected to the first transistor;
   a storage capacitor comprising a first storage electrode electrically connected to the lower electrode, and a second storage electrode overlapping the first storage electrode;
   a shielding electrode at a same layer as the lower electrode or as the first semiconductor;
   a data line overlapping the shielding electrode, and configured to transmit a data voltage; and
   an auxiliary electrode between the shielding electrode and the data line, overlapping the shielding electrode, and adjacent to the first gate electrode.

2. The light-emitting display device of claim 1, wherein, in plan view, a distance between the auxiliary electrode and the first gate electrode is less than a distance between the data line and the first gate electrode.

3. The light-emitting display device of claim 1, wherein, in plan view, a distance between the auxiliary electrode and the first gate electrode is less than a distance between the shielding electrode and the first gate electrode.

4. The light-emitting display device of claim 1, wherein the auxiliary electrode is in an electrically floating state.

5. The light-emitting display device of claim 1, wherein the auxiliary electrode is at a same layer as the first gate electrode.

6. The light-emitting display device of claim 1, wherein a length of the auxiliary electrode is equal to or greater than a length of the first gate electrode.

7. The light-emitting display device of claim 1, further comprising an auxiliary driving voltage line above the substrate, and configured to transmit a driving voltage,
    wherein the shielding electrode is electrically connected to the auxiliary driving voltage line.

8. The light-emitting display device of claim 7, wherein the shielding electrode, the first semiconductor, and the second storage electrode are integrally formed.

9. The light-emitting display device of claim 8, further comprising a hold capacitor comprising a first hold electrode and a second hold electrode,
    wherein the first hold electrode comprises a portion of the auxiliary driving voltage line overlapping the second hold electrode, and
    wherein the second hold electrode is integrally formed with the second storage electrode.

10. The light-emitting display device of claim 7, wherein the shielding electrode is integrally formed with the auxiliary driving voltage line.

11. The light-emitting display device of claim 10, further comprising a hold capacitor comprising a first hold electrode and a second hold electrode,
    wherein the first hold electrode comprises a portion of the second storage electrode overlapping the second hold electrode, and
    wherein the second hold electrode is electrically connected to the auxiliary driving voltage line.

12. The light-emitting display device of claim 10, further comprising:
    a driving voltage line electrically connected to the auxiliary driving voltage line; and
    a hold capacitor comprising a first hold electrode and a second hold electrode,
    wherein the first hold electrode comprises a portion of the second storage electrode overlapping the second hold electrode, and
    wherein the second hold electrode comprises an extension of the driving voltage line.

13. The light-emitting display device of claim 1, wherein the first semiconductor comprises an oxide semiconductor.

14. The light-emitting display device of claim 1, further comprising:
    a connecting member electrically connecting the first gate electrode and the first storage electrode;
    a first insulating layer between the lower electrode and the first semiconductor;
    a second insulating layer between the first semiconductor and the first gate electrode; and
    a third insulating layer between the first gate electrode and the connecting member.

15. The light-emitting display device of claim 14, further comprising a second transistor comprising a second gate electrode and a second semiconductor,
    wherein the data line is electrically connected to one end of the second semiconductor, and
    wherein the connecting member is electrically connected to another end of the second semiconductor.

16. A light-emitting display device comprising:
    a first gate line extending in a first direction, and configured to transmit a first gate signal;
    a data line extending in a second direction crossing the first direction, and configured to transmit a data signal;
    a first transistor comprising a first semiconductor, and a first gate electrode overlapping the first semiconductor;
    a second transistor comprising a second semiconductor electrically connected to the data line, and a second gate electrode electrically connected to the first gate line;
    a shielding electrode overlapping the data line, and configured to receive a driving voltage; and
    an auxiliary electrode between the data line and the shielding electrode in a third direction crossing the first direction and the second direction, at least a portion of the auxiliary electrode being between the data line and the first gate electrode in plan view with respect to the first direction.

17. The light-emitting display device of claim 16, wherein, in plan view, a distance between the auxiliary electrode and the first gate electrode is less than a distance between the data line and the first gate electrode.

18. The light-emitting display device of claim 16, wherein the auxiliary electrode is in an electrically floating state.

19. The light-emitting display device of claim 16, wherein the auxiliary electrode overlaps the first gate electrode in the first direction.

20. The light-emitting display device of claim 16, further comprising an auxiliary driving voltage line extending in the first direction, and configured to transmit the driving voltage,
    wherein the shielding electrode is electrically connected to, or integrally formed with, the auxiliary driving voltage line.

* * * * *